(12) United States Patent
Hadji-Abdolhamid et al.

(10) Patent No.: US 8,841,968 B2
(45) Date of Patent: Sep. 23, 2014

(54) CLASS-AB RADIO FREQUENCY AMPLIFIER FOR ENVELOPE DETECTOR

(71) Applicant: Broadcom Corporation, Irvine, CA (US)

(72) Inventors: Amir Hadji-Abdolhamid, Aliso Viejo, CA (US); Janice Chiu, Tustin, CA (US)

(73) Assignee: Broadcom Corporation, Irvine, CA (US)

( * ) Notice: Subject to any disclaimer, the term of this patent is extended or adjusted under 35 U.S.C. 154(b) by 33 days.

(21) Appl. No.: 13/627,437

(22) Filed: Sep. 26, 2012

(65) Prior Publication Data
US 2014/0085007 A1    Mar. 27, 2014

(51) Int. Cl.
  *H03F 3/45*    (2006.01)
(52) U.S. Cl.
  USPC .......................................... 330/260; 330/252
(58) Field of Classification Search
  USPC .......................... 330/252–261, 264
  See application file for complete search history.

(56) References Cited

U.S. PATENT DOCUMENTS 7,710,197 B2 *   5/2010  Aoki et al. .................... 330/252
8,325,848 B2 *  12/2012  Mirzaei et al. ................ 375/295

OTHER PUBLICATIONS

Cha, Jeongwon, et al., "A Highly-Linear-Radio-Frequency Envelope Detector for Multi-Standard Operation," 2009 IEEE Radio Frequency Integrated Circuits Symposium, pp. 149-152 (Jun. 2009).
Koli, Kimmo, et al., "Low voltage MOS-transistor-only precision current peak detector with signal independent discharge time constant," 1997 IEEE International Symposium on Circuits and Systems, pp. 1992-1995 (Jun. 1997).
Meyer, Robert G., "Low-Power Monolithic RF Peak Detector Analysis," IEEE Journal of Solid-State Circuits, vol. 30, No. 1, pp. 65-67 (Jan. 1995).

* cited by examiner

*Primary Examiner* — Hieu Nguyen
(74) *Attorney, Agent, or Firm* — Brinks Gilson & Lione

(57) ABSTRACT

An envelope detector (ED) includes a voltage-mode ED core including parallel detection transistors for detecting a voltage envelope of a radio frequency (RF) signal input, the RF signal input including an output of a radio such as a cellular transmitter (TX). The ED further includes multiple voltage amplifiers positioned serially in gain stages between the TX output and the ED core to provide a total linear voltage range of the envelope detector. A final voltage amplifier of the multiple voltage amplifiers drives the ED core and includes a class-AB RF amplifier configured to operate within a full linear voltage range of the ED core.

20 Claims, 21 Drawing Sheets

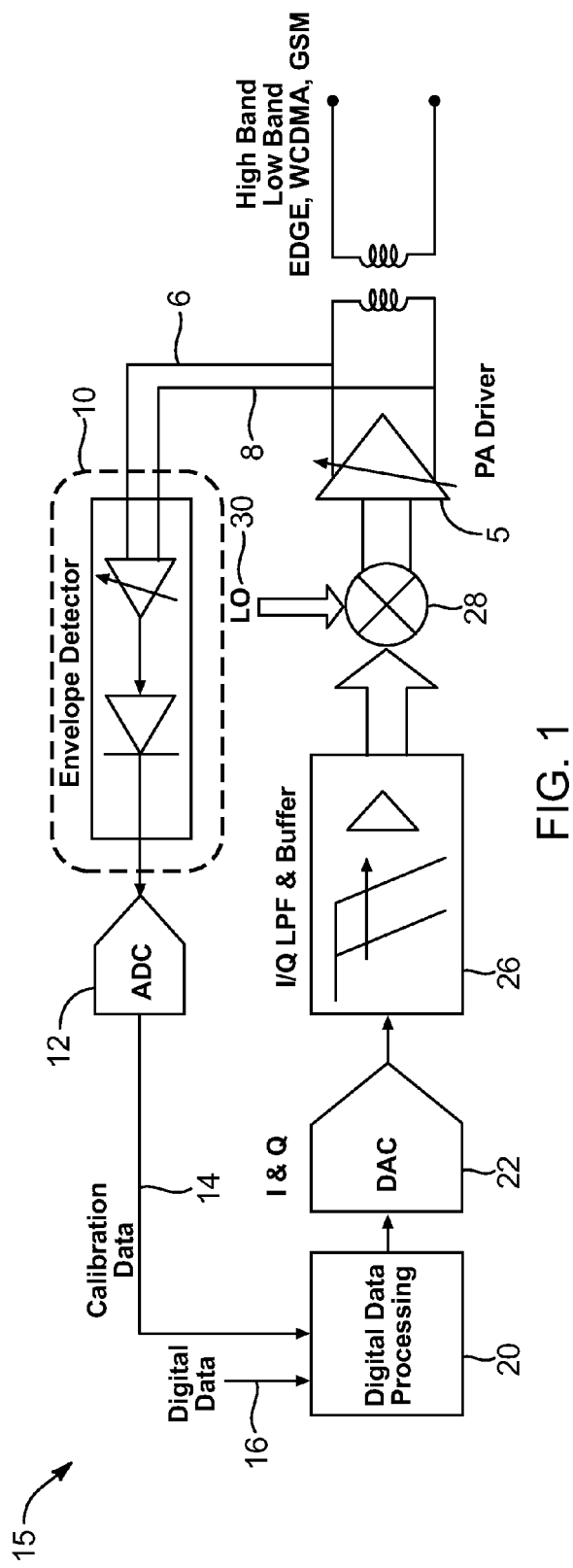
FIG. 1
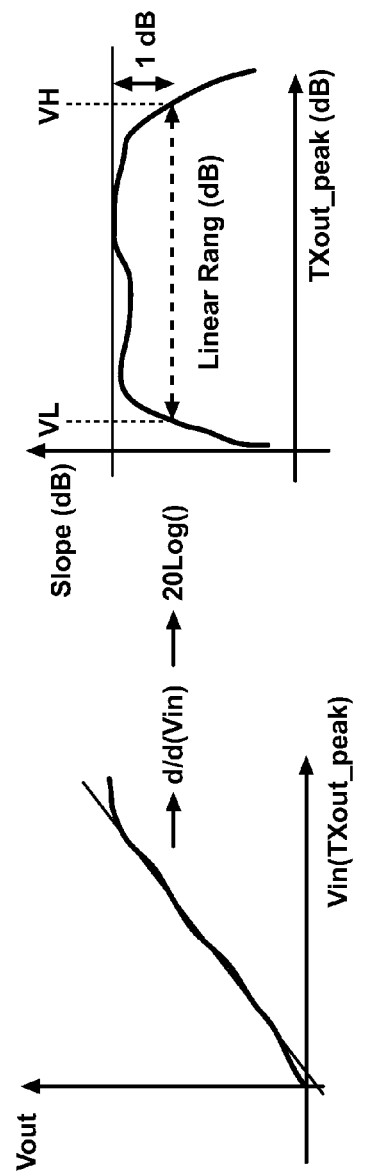
FIG. 2A
FIG. 2B

US 8,841,968 B2

CLASS-AB RADIO FREQUENCY AMPLIFIER FOR ENVELOPE DETECTOR

TECHNICAL FIELD

This disclosure relates to an envelope detector (ED), and more particularly, an ED core with an enhanced linear range that eliminates the need for an external envelope detector or excessive factory open loop power calibration, and to a linearizer and a specialized class-AB amplifier that may be used with the ED core.

BACKGROUND

Rapid advances in electronics and communications technologies, driven by immense customer demand, have resulted in the widespread adoption of data-driven devices, including cellular phones, smart phones and global positioning devices (GPSs), to name just a few. Envelope detectors (EDs) detect the voltage amplitude of a radio frequency (RF) signal output from a transmitter (TX) of such cellular devices for purposes of calibration or power detection. For instance, the envelope or peak information of the TX output may be used for calibration of LOFT (Local Oscillator (LO) feedthrough), IQ (in-phase/quadrature) mismatch and power level control. An envelope detector can also be used for envelope tracking of voltage amplifier supply to save power by decreasing the supply when the output is low. Peak to average ratio and dynamic range of the TX output may require stringent linear ranges for an ED core integrated within a cellular transmitter. During ED conversion, a linearity accuracy within plus or minus 0.5 dB may be expected for proper calibration and envelope tracking.

BRIEF DESCRIPTION OF THE DRAWINGS

The innovation may be better understood with reference to the following drawings and description. In the figures, like reference numerals designate corresponding parts throughout the different views.

FIG. 1 is an example circuit showing typical placement of an envelope detector (ED) within a cellular transmitter (TX).

FIGS. 2A and 2B are, respectively, graphs of: (a) $V_{out}$ versus $V_{in}$ ($TX_{out\_peak}$), or $V_{out}/V_{in}$, of an envelope detector; and (b) the slope of $V_{out}/V_{in}$ of FIG. 2A in decibels (dB).

DETAILED DESCRIPTION

Figure 3A:
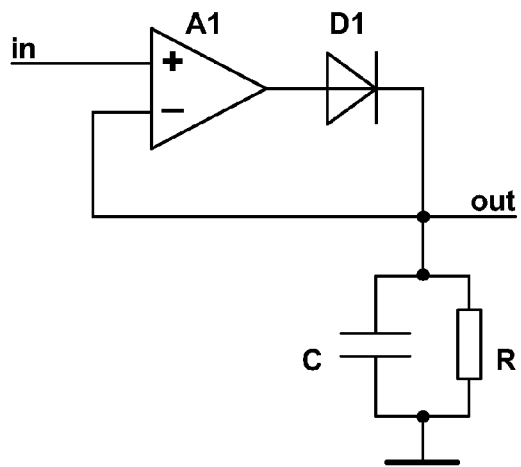
FIGS. 3A, 3B and 3C are example conventional envelope detectors, respectively that use: (a) an operational amplifier; (b) a current mode, operation transconductance amplifier (OTA); and (c) a voltage mode ED that employs complementary metal-oxide-semiconductor (CMOS) devices.

The discussion below makes reference to an envelope detector (ED) with an enhanced linear range and accuracy, which adds calibration capability of LOFT (Local Oscillator (LO) feedthrough), IQ (in-phase/quadrature) mismatch and closed-loop power level control. Furthermore, the enhanced high-performance ED design reduces the number of factory calibration points, and may eliminate the need for external envelope detection or excessive factory open loop power calibration, making the manufacture of the cellular phones (or other radio application) chips more cost effective. Gain and bias programmability features also make an ED core of the enhanced ED more generic for various envelope and peak detections for calibration purposes in future chip generations and applications.

The high-performance ED is also power-efficient and area-efficient in design. The entire envelope detector, including voltage amplifiers, takes only about 0.1 mm² of chip space. Furthermore, by using subthreshold biasing of detecting transistors, a specially-designed class-AB amplifier, and programmability to reduce the current to amplifiers when not required, makes the enhanced ED quite power efficient. In some implementations, for example, the ED core, which is part of the overall ED design, consumes about 200 uA on average from a 1.2V power supply.

The enhanced ED automates incorporation of feedback signals that sets biases to enhance linearity of operation. This automated feedback capability combined with programmability in various gain stages, makes the enhanced ED design usable in multi-mode solutions. For instance, the ED may be useable with next-generation products including with products that employ the following non-exhaustive list of standards: Global System for Mobile Communications (GSM), Second Generation (2G), General Packet Radio Services (GPRS), Third Generation (3G), Third Generation Partnership Project (3GPP), Enhanced Data Rates for GSM Evolution (EDGE), Fourth Generation (4G) (Mobile WiMax and LTE) and Wideband Code Division Multiple Access (W-CDMA), among other high band and low band standards.

The discussion below makes further reference to a voltage-mode envelope detector core that includes parallel detection transistors for detecting a voltage envelope of a radio frequency (RF) signal input, which input may come from a cellular transmission (TX) output. The ED core may output positive and negative, or differential, voltage ED outputs as a detected envelope of the RF signal input. The detection transistors may be configured with a size and for a current to be biased in subthreshold regions of operation. The ED core may be configured to variably control a bias current through the detection transistors, where the bias current is varied proportionally to the voltage amplitude of the RF signal input such that the detection transistors continue to operate in subthreshold regions.

In one example, the detection transistors may include a pair of transistors configured to output the positive ED output and a pair of transistors configured to output the negative ED output. The ED core may include a current-biasing transistor for each pair (or group) of detection transistors, where a bias voltage of the current-biasing transistors determines the bias current for each pair of detection transistors, the bias voltage being determined from the positive and negative differential ED outputs.

In a further example, a linearizer may be connected in a feedback loop between the ED outputs and the ED core, to control the bias current of the detection transistors according to voltage amplitude of the ED outputs. The linearizer may include a linearizer circuit configured with a differential amplifier connected to the differential positive and negative ED outputs. The linearizer circuit may be configured to generate the bias voltage for the current-biasing transistors as proportional to a difference between the positive and negative ED outputs, while the detection transistors continue to operate in subthreshold regions despite a larger biasing current.

Multiple voltage amplifiers may be positioned serially in gain stages between the TX output and the ED core to provide a total linear range of the envelope detector. A final voltage amplifier of the multiple voltage amplifiers that directly drives the ED core may be a specialized class-AB RF amplifier configured to operate within a full linear range of the ED core.

FIG. 1 is an example circuit showing typical placement of an envelope detector (ED) 10 within a cellular transmitter (TX) 15. A voltage amplifier driver 5 outputs positive and negative (or differential) TX voltage outputs 6 and 8 that become inputs to the ED 10. Different conventional designs for the ED 10 are discussed with reference to FIGS. 3 and 4 that sense or detect amplifier power.

The ED 10 detects a voltage envelope of the TX outputs 6 and 8 by detecting voltage peaks of the TX voltage RF output signals. The ED 10 outputs the detected voltage envelope to an analog-to-digital converter 12, which provides calibration data 14 to be combined with digital data 16 from other parts of the cellular TX before being processed by a digital data processing block 20. The digital data processing block 20 yields signals after having been digitally processed.

A pair of digital-to-analog converters 22 may then convert the processed in-phase and quadrature (I&Q) digital signals back to analog signals. An in-phase/quadrature (I/Q) low pass filter (LPF) and buffer block 26 may further filter and calibrate the analog signals. A mixer 28 may then modulate the filtered signal with a clock 30 before the signal is amplified by the voltage amplifier driver 5 for transmission. The amplified signal may be further filtered or processed before final transmission.

FIG. 2A is a graph of $V_{out}$ versus $V_{in}$ ($TX_{out\_peak}$), or $V_{out}/V_{in}$, of an envelope detector. FIG. 2B is a graph of the slope of $V_{out}/V_{in}$ of FIG. 2A in decibels (dB) where an effective linear range of the ED is set within 1 dB of maximums at shown as $V_H$ and $V_L$. Because the envelope detector is used in calibration or power detection, the relevant algorithms call for a minimum linear accuracy in the power or voltage level detection. The slope of $V_{out}/V_{in}$ is ideally constant, shown as a straight line in FIG. 2A. The effective linear range of envelope detecting is determined by $20 \log(V_H/V_L)$. For instance, when $V_H$ is 150 mV and $V_L$ is 30 mV, $20 \log(V_H/V_L)$ equals about 14 dB.

Figure 3B:
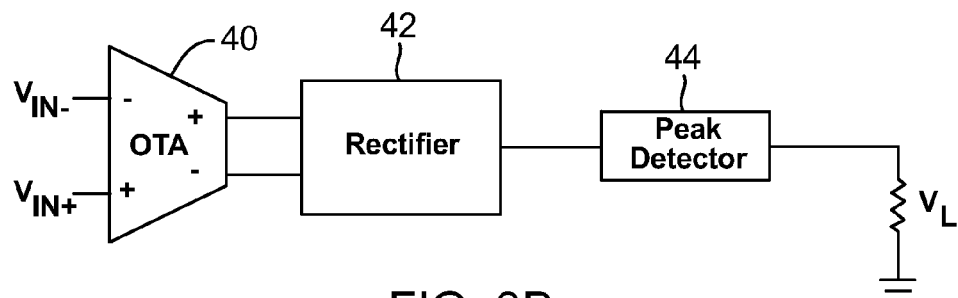
Figure 3C:
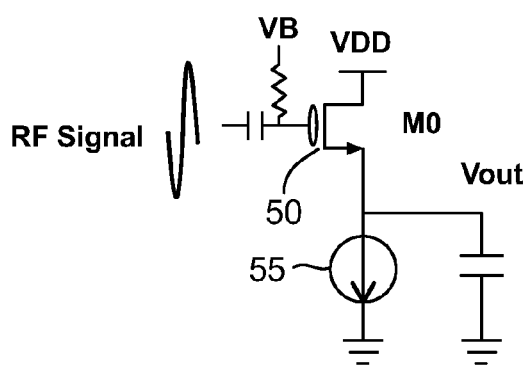

FIGS. 3A, 3B and 3C are example conventional envelope detectors (EDs).

FIG. 3A is an ED that uses a feedback operational amplifier ("opamp") A1 followed by a diode D1. The ED of FIG. 3A may be limited by the gain bandwidth product of the operational amplifier, and thus may not be the best choice for high frequency RF signals, depending on application and choice of opamp.

FIG. 3B is a current-mode operational transconductance amplifier (OTA)-based ED in which an OTA 40 is followed by a rectifier 42 and a peak detector 44. The ED of FIG. 3B may call for a high speed and linear OTA that may be power hungry when compared with the ED of FIG. 3C.

FIG. 3C is a voltage-mode ED that employs a complementary metal-oxide-semiconductor (CMOS) transistor (or other type of integrated circuit transistor) 50 and a current source 55. The ED of FIG. 3C can be more power efficient, but may not provide sufficient linear range due to performance degradation of the detector at small signal levels and saturation at large signal levels.

Figure 4:
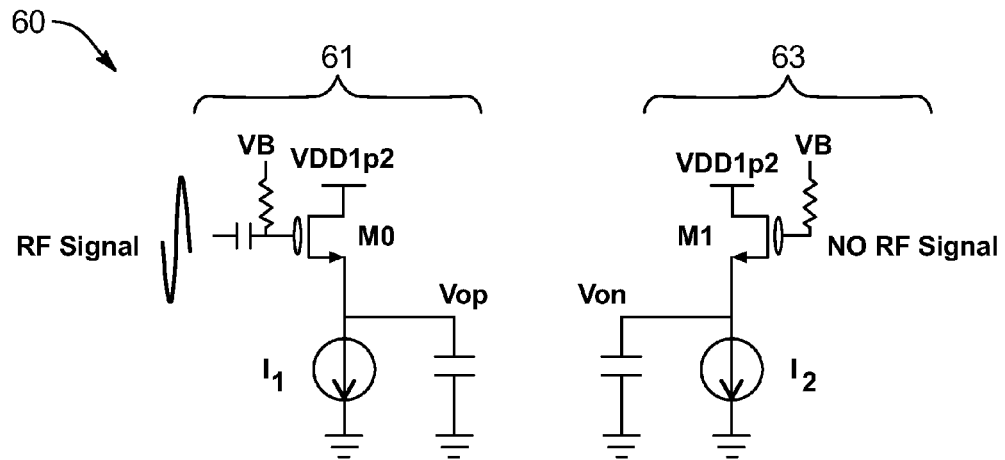
FIG. 4 is an example conventional envelope detector core like the ED of FIG. 3C, but that generates positive and negative, or differential, voltage outputs.

FIG. 4 is an example conventional ED core 60 like the ED of FIG. 3C, but that generates positive and negative, or differential, voltage outputs. The ED core 60 includes a positive half 61 and a negative half 63, each half configured substantially the same except that the transistor M0 of the first half 61 is driven by the RF signal input of the envelope detector while the transistor M1 of the second half 63 is not driven by the RF signal. The first half 61 of the ED generates a positive voltage ED output (Vop) while the second half 63 of the ED generates a negative voltage ED output (Von), which together generate a differential voltage output of the ED core 60.

A bias voltage (VB) also drives gates of the transistors M0 and M1 and direct current (DC) current sources ($I_1$, $I_2$) are provided at the respective sources of each transistor M0 and M1 to set the operating point and mode of M0 and M1, respectively. The transistors M0 and M1 may be CMOS transistors or any other kind of integrated circuit (IC) transistor (such as bi-polar or field effect transistors (FETs) for instance). The transistors referred to throughout this disclosure may be any type or combination of transistors.

An even non-linearity develops a voltage at Vop such that the DC current ("I") matches the average DC current of the transistor M0. Even nonlinearity can come from the square law in the saturation region of the transistor; from the exponential IN equation in the subthreshold region of the transistor; or from the transition between the two. The ED core 60 of FIG. 4 is commonly biased in saturation, which provides a linear range of about 10 dB, which may be insufficient for TX multi-purpose calibration applications. A transistor is biased in saturation when $V_{GS}$ is larger than a threshold voltage.

Detecting transistors (M0 and M1 of FIG. 5 or FIG. 9) of the ED core 102 may be operated in subthreshold bias regions by subthreshold biasing, made possible because of the exponential IN relation. Such subthreshold biasing improves the linearity of Vop versus the RF input 106 and 108 while saving significantly on power.

Figure 5:
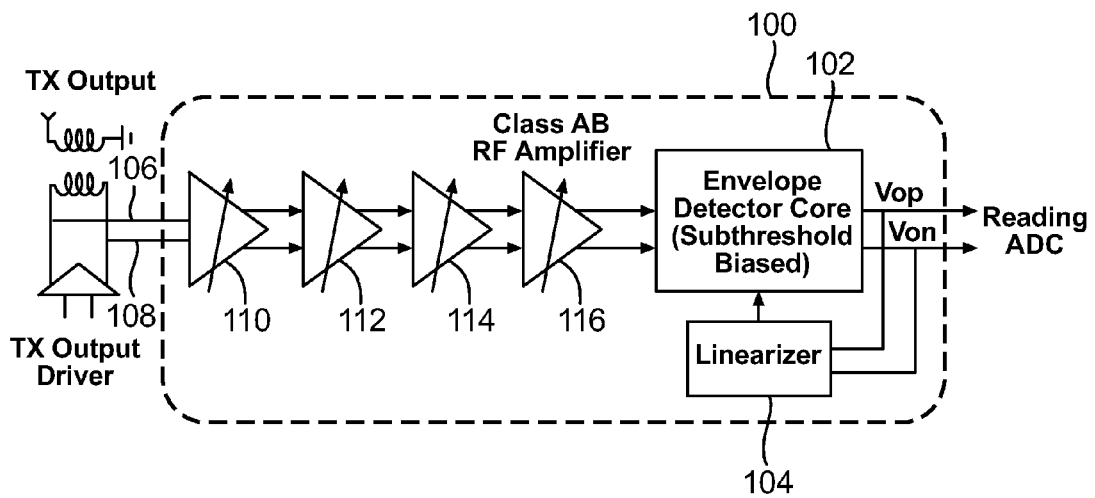
FIG. 5 is a high-level circuit diagram showing the interrelation of an envelope detector core, which operates detecting transistors in subthreshold bias regions, with a linearizer, and several amplifiers the last of which may be a specialized class-AB amplifier.

FIG. 5 is a high-level circuit diagram of an enhanced envelope detector (ED) 100, showing the interrelation of an envelope detector core 102 with a feedback linearizer 104 and a specialized class-AB amplifier 116.

The feedback linearizer 104 may vary the bias of the detecting transistors according to an input envelope amplitude, to significantly improve the linear range of the ED core 102 while reducing total power of the ED as well. The linearizer 106 will be discussed in more detail with reference to FIGS. 9 and 10.

Multiple voltage amplifiers, such as voltage amplifiers 110, 112 and 114 (FIG. 12), may be positioned in serial gain stages between the TX output and the class-AB amplifier 116, sufficient to provide the total linear range of about 60 dB as listed in Table 1. Each gain stage may be variably controlled.

The specialized class-AB amplifier 116 may also be referred to as a class-AB driver in directly driving the ED core 102. The class-AB amplifier 116 may be configured to provide a signal within a full linear voltage range of the ED 100, which also provides power savings to the ED. The class-AB amplifier, therefore, improves usability of the ED core as the RF signal input to the ED core may go up to approximately a 1V peak. The specialized class-AB amplifier 116 will be discussed in more detail with reference to FIGS. 13A and 13B.

Specifications for designing the enhanced ED were set according to Table 1. These specifications were met or exceeded by the enhanced ED design, discussed in more detail below, without excessive power or area penalties.

TABLE 1

| Parameter | Specifications Values | Comments |
| --- | --- | --- |
| Linear Range of ED Core | ~20 dB | The linear range window was desired for any gain setting, i.e. the linear range of the ED core. |
| Total Linear Range | ~60 dB (−55−+5 dBm) | ED core and gain stages with swept gains (FIG. 5, the architecture and FIG. 16, the results). |
| Linear Range Overlap | >4 dB | The overlap of linear ranges for each gain setting (FIG. 16). |
| TX Output Loading Effect (power jump) | <0.4 dBm | The TX output power should not change or jump when an ED, which is connected to TX output, powers up or its gain settings change. |

In the subthreshold regions, the current of detecting transistors (M0 and M1 of FIG. 4, for instance) is an exponential function of gate-source voltage ($V_{GS}$). More specifically, $$I_{M0} = I_S e^{\frac{(v_{GS} - v_{TH})}{nV_T}} \quad (1)$$

where $V_{TH}$ is a threshold voltage of the transistor, $I_S$ is the current at $V_{GS}=V_{TH}$. $nV_T$=nKT/q≅×26 mV≈32.5 mV, n is a slope factor, $V_T$ is a thermal voltage, T is absolute temperature, K is the Boltzmann constant and q is the electron charge.

With reference to FIG. 4, considering the RF input signal as $V_m \cos(\omega t)$ with a peak amplitude of $V_m$ and a bias voltage $V_B$, Equation (1) can be rewritten as:

$$I_{M0} = I_S e^{\frac{(v_g + v_m \cos(\omega t) - v_{op} - v_{TH})}{nV_T}} \quad (2)$$

The input signal portion from Equation (2) can be expanded as:

$$e^{\frac{(v_m \cos(\omega t))}{nV_T}} = [I_0(b) + 2I_1(b)\cos(\omega t) + 2I_2(b)\cos(\omega t) + \ldots] \quad (3)$$

where $I_k(b)$ is a modified Bessel function of order k, and $$b = \frac{V_m}{nV_T}.$$

Considering the fact that the average current of M0 is equal to current source current $I_1$ in FIG. 4), the current $I_1$ can be derived from Equations (2) and (3) as:

$$I_1 = \overline{I_{M0}} = I_S e^{\frac{(V_s - v_{op} - V_{TH})}{V_T}} I_0(b) \quad (4)$$

Similarly for M1 with no input RF signal in FIG. 4, Equation (1) can rewritten as:

$$I_2 = \overline{I_{M1}} = I_S e^{\frac{(V_g - v_{on} - V_{TH})}{V_T}} \quad (5)$$

Dividing Equation (5) by Equation (4) and taking the logarithm from both sides, after rearrangement, yields:

$$V_{out} = V_{op} - V_{on} = nV_T \cdot \ln\left(\frac{I_2}{I_1}\right) + nV_T \cdot \ln\left(I_0\left(\frac{V_m}{nV_T}\right)\right) \quad (6)$$

Figure 6A:
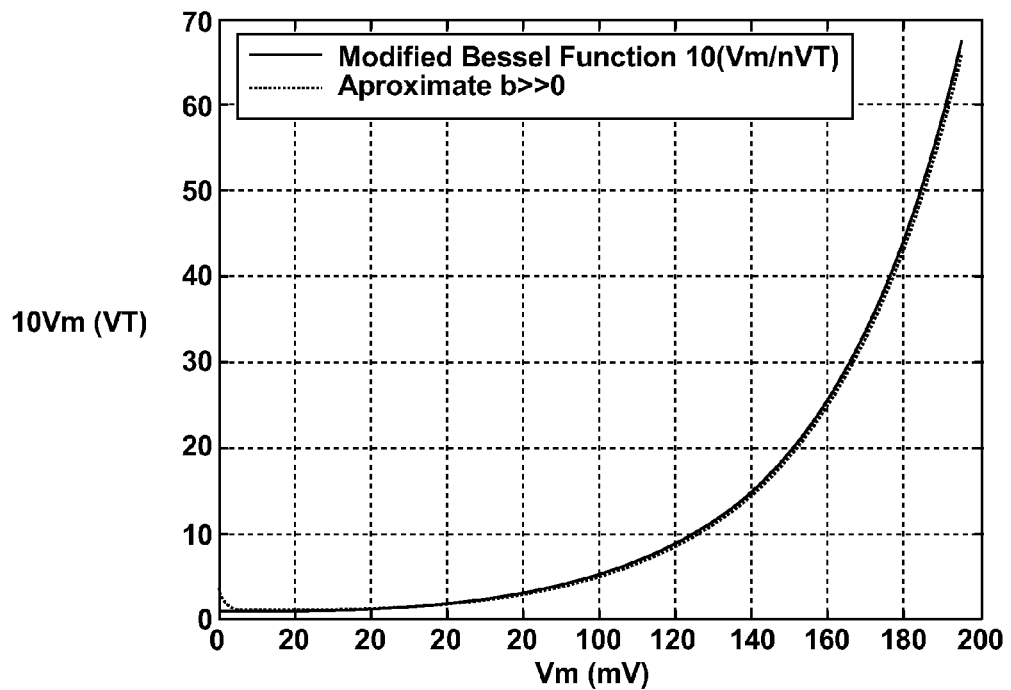
FIGS. 6A and 6B respectively are graphs of $I_0(b)$ and $\ln(I_0(b))$ versus b, where $I_k(b)$ is a modified Bessel function of order k and $$b = \frac{V_m}{nV_T}.$$
Figure 6B:
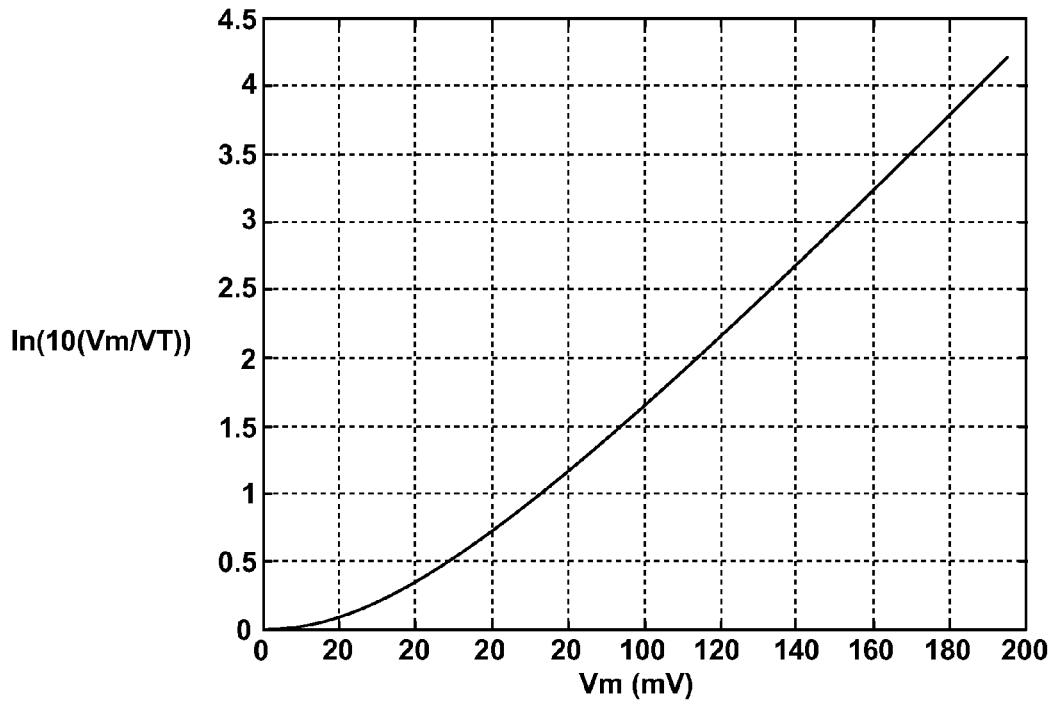

FIGS. 6A and 6B are, respectively, graphs of $$I_0\left(\frac{V_m}{nV_T}\right) \text{ and } l_n\left(I_0\left(\frac{V_m}{nV_T}\right)\right)$$

versus $V_m$. The value of $$I_0\left(\frac{V_m}{nV_T}\right)$$

in Equation (6) is mostly an exponential function of $V_m$. The exponential behavior of $I_0(b)$ makes $V_{out}$ mostly a linear function of $V_m$ for reasonable sizes of $V_m$.

The dotted curve in FIG. 6A may be derived from a known approximation $$I_{0(b)} = \frac{e^b}{\sqrt{2\pi b}}$$

for large b. Thus, Equation (6) can be written as $$V_{out} = nV_T \cdot \ln\left(\frac{I_2}{I_1}\right) + V_m - \frac{nV_T}{2}\ln(2\pi V_m / V_T) \quad (7)$$

And thus the slope of $V_{out}$ versus input amplitude will be:

$$\frac{dV_{out}}{dV_m} = 1 - \frac{nV_T}{2} \cdot \frac{1}{V_m} \quad (8)$$

As can be seen from Equation (8), the nonlinear term in the slope is diminished at larger $V_m$.

Accordingly, the subthreshold biasing of the ED not only saves power, but also improves linearity performance in the detecting performance by the ED 100, e.g., up to at least approximately 4 dB of additional linear range for the ED core.

Moreover, there are other second-order effects improved upon by the ED 100. Such second-order effects may include, for instance, dependency of current and output to $V_{ds}$ of both M0 and DC current sources. Another second-order effect may include how deep M0 is operating in the subthreshold region. Introducing subthreshold biasing improves the linearity compared to standard saturation ED by at least 4 dB, but another 5-6 dB improvement may be achieved by compensating for the second-order effects in the feedback scheme that includes the linearizer 104, as will be discussed.

Figure 7:
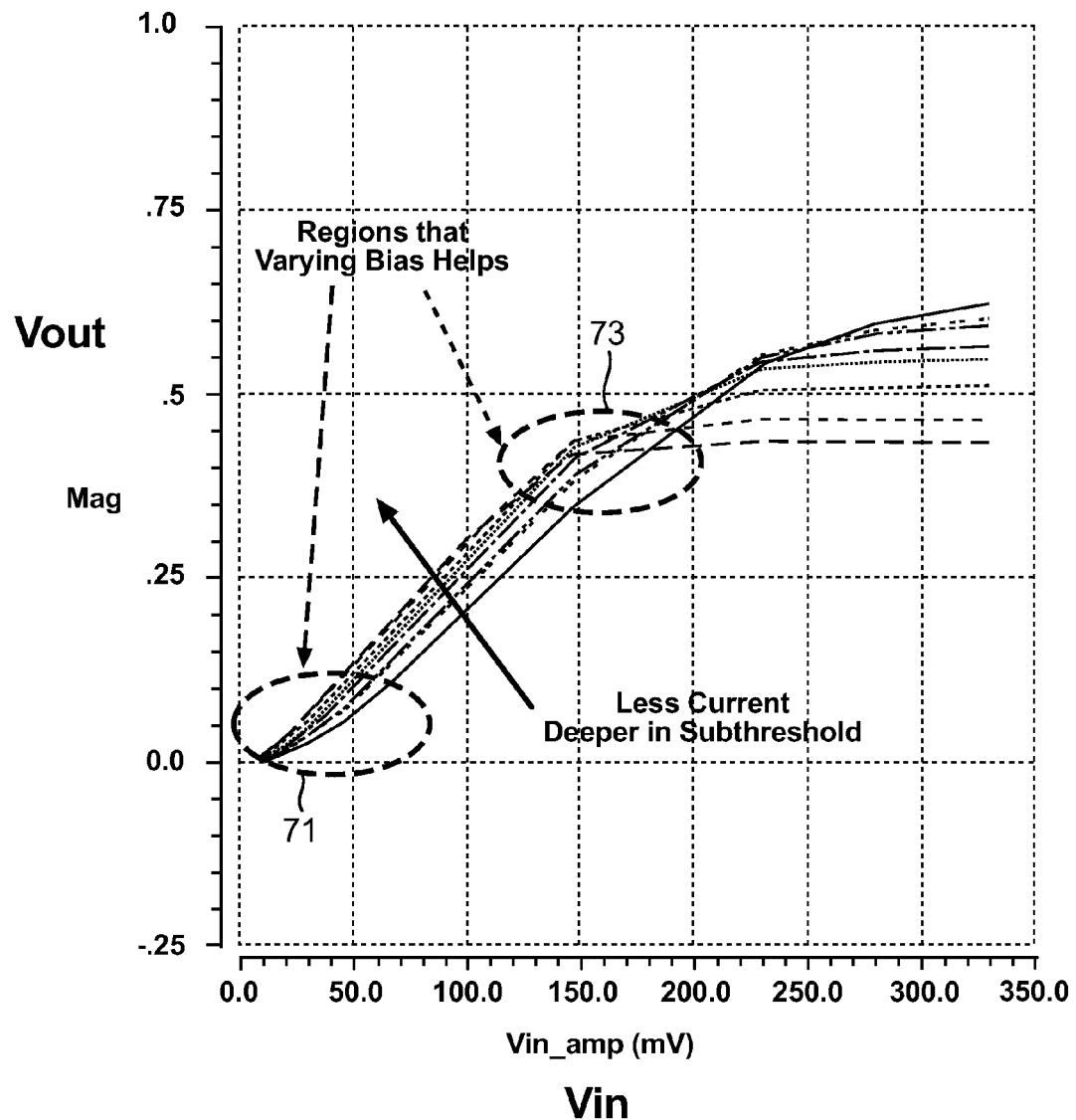
FIG. 7 is a graph of $V_{out}$ versus $V_{in}$ of the ED core of FIG. 4, showing regions where varying current bias of ED transistors helps.
Figure 8:
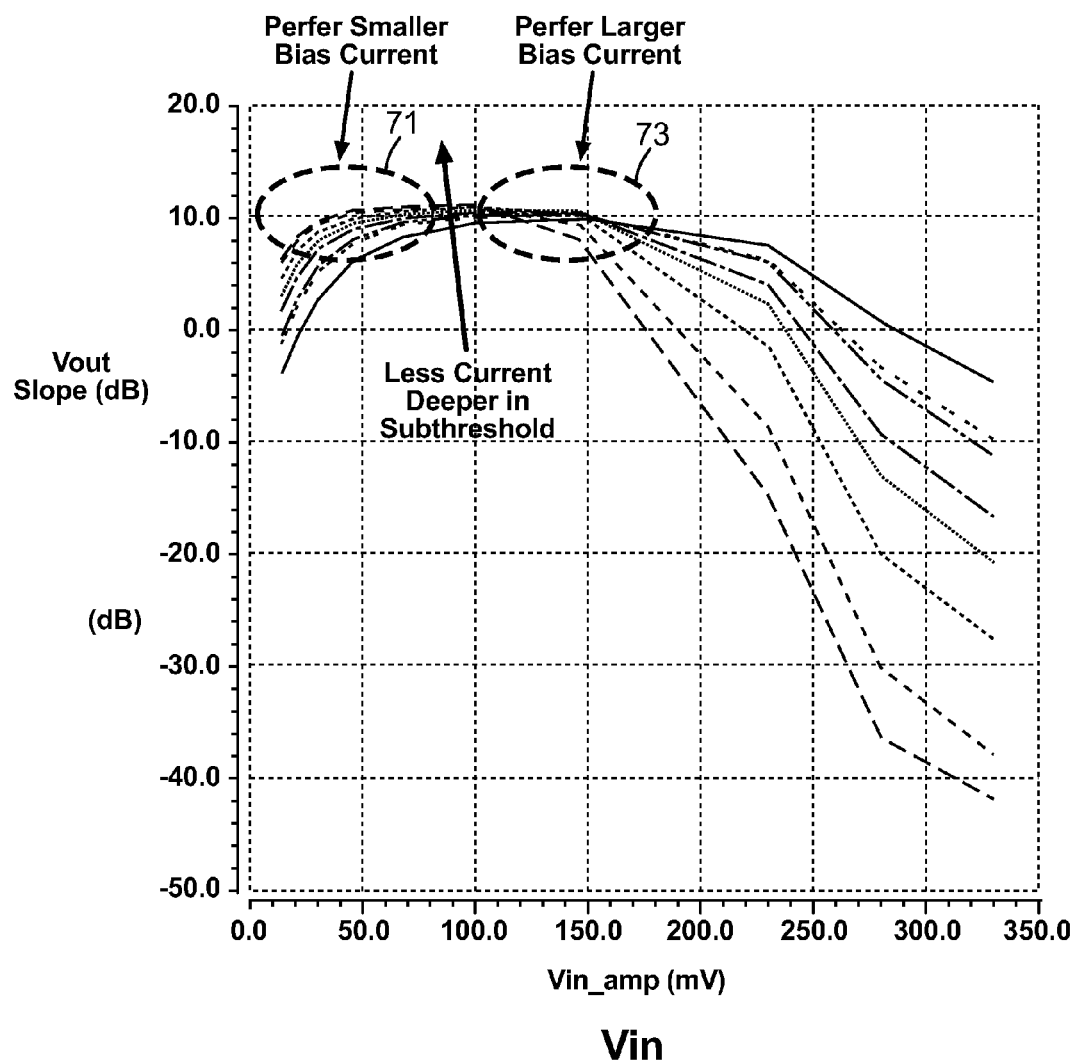
FIG. 8 is a graph of the slope of $V_{out}$ versus $V_{in}$ of the ED core of FIG. 4, showing regions where smaller bias current is preferred and regions where larger bias current is preferred.

FIG. 7 is a graph of $V_{out}$ versus $V_{in}$ of the ED core 60, showing regions 71 and 73 where varying current bias of ED transistors helps. FIG. 8 is a graph of the slope of $V_{out}$ versus $V_{in}$ of the ED core 60, showing region 71 where smaller bias current is preferred and region 73 where larger bias current is preferred. More specifically, for a small RF input signal amplitude, lower bias (or deeper subthreshold) provides a better linearity performance. On the other hand, due to shrinking $V_{ds}$ with larger input RF signal, larger biasing helps in region 71, which reduces $V_{op}$ and increases $V_{ds}$, thus providing a larger potential detection range despite the larger input RF signal.

Figure 9:
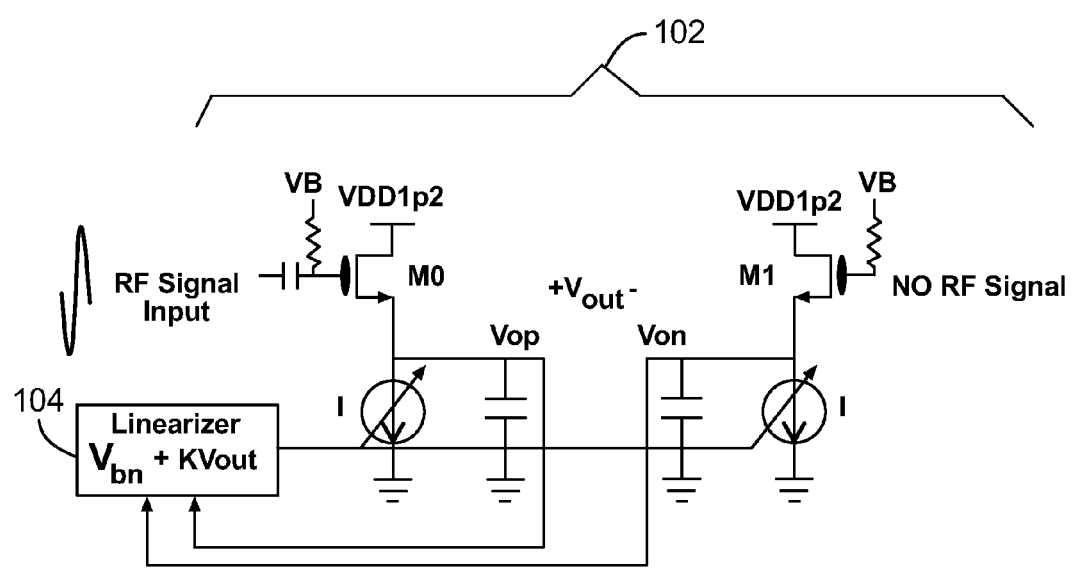
FIG. 9 is an example circuit diagram of an ED core enhanced with variable control of subthreshold bias current of ED transistors using a feedback linearizer.

FIG. 9 is an example circuit diagram of an ED core 102 enhanced with variable control of subthreshold bias current of ED transistors using the feedback linearizer 104. The bias current, which in FIG. 9 is shown as DC current bias blocks (I), may be varied in relation to the amplitude of the RF input signal. Conveniently, the RF input signal is available at the ED output, so a feedback loop may be designed.

The feedback linearizer 104 receives the differential ED output, $V_{out}$, and varies the bias current sources (I) in the ED core 100 according to the amplitude of $V_{out}$. More specifically, the linearizer output ($V_{bn}$). may be set as $V_{bn}+KV_{out}$, thus being proportional to the differential ED output, where K is the gain of the linearizer. How K is determined will be discussed with reference to FIG. 10A. While the bias current changes with input RF envelope amplitude of the RF input signal, the ED transistors M0 and M1 will be kept in subthreshold regions.

Figure 10A:
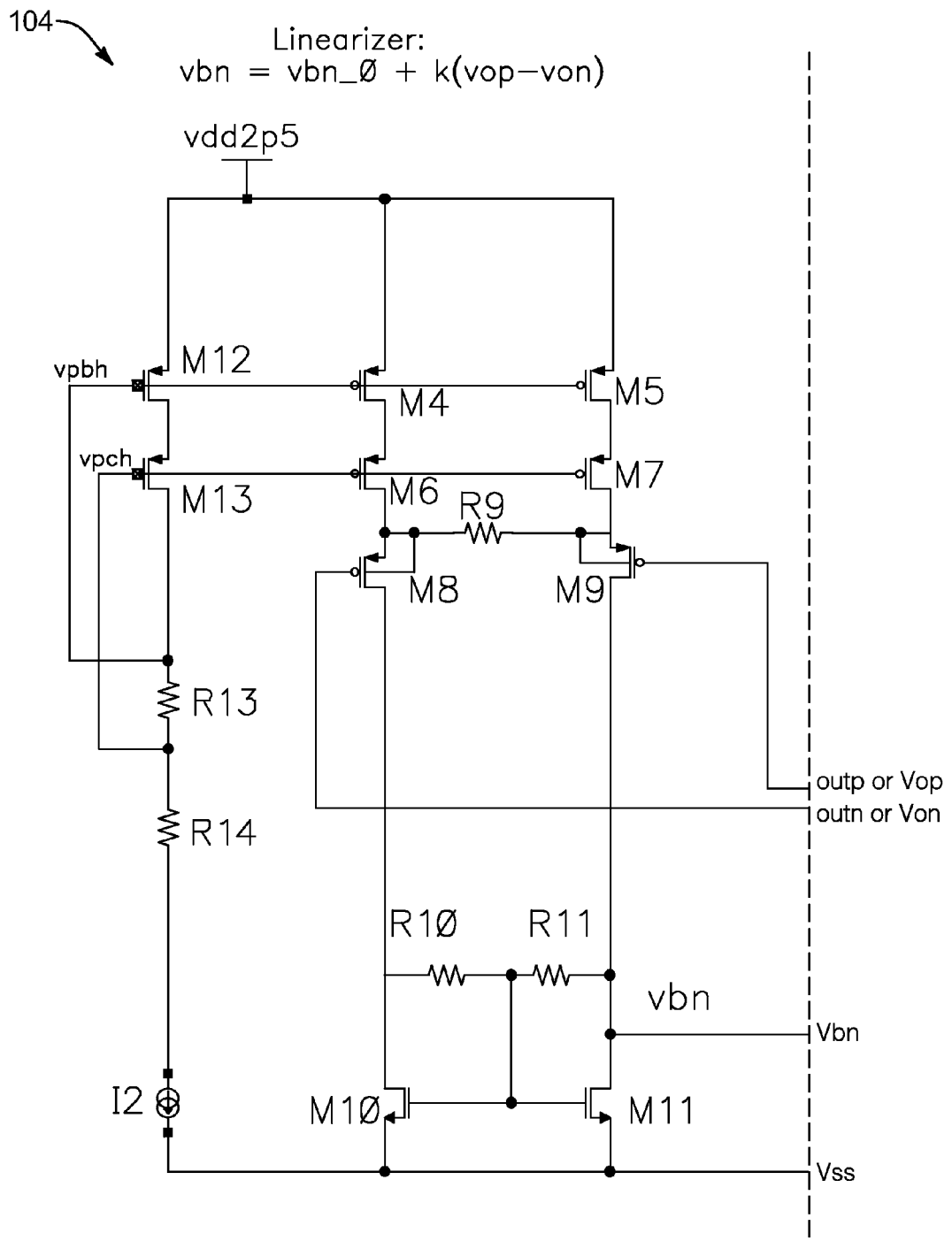
FIGS. 10A and 10B is an example circuit of a bias-varying ED core with feedback linearizer.
Figure 10B:
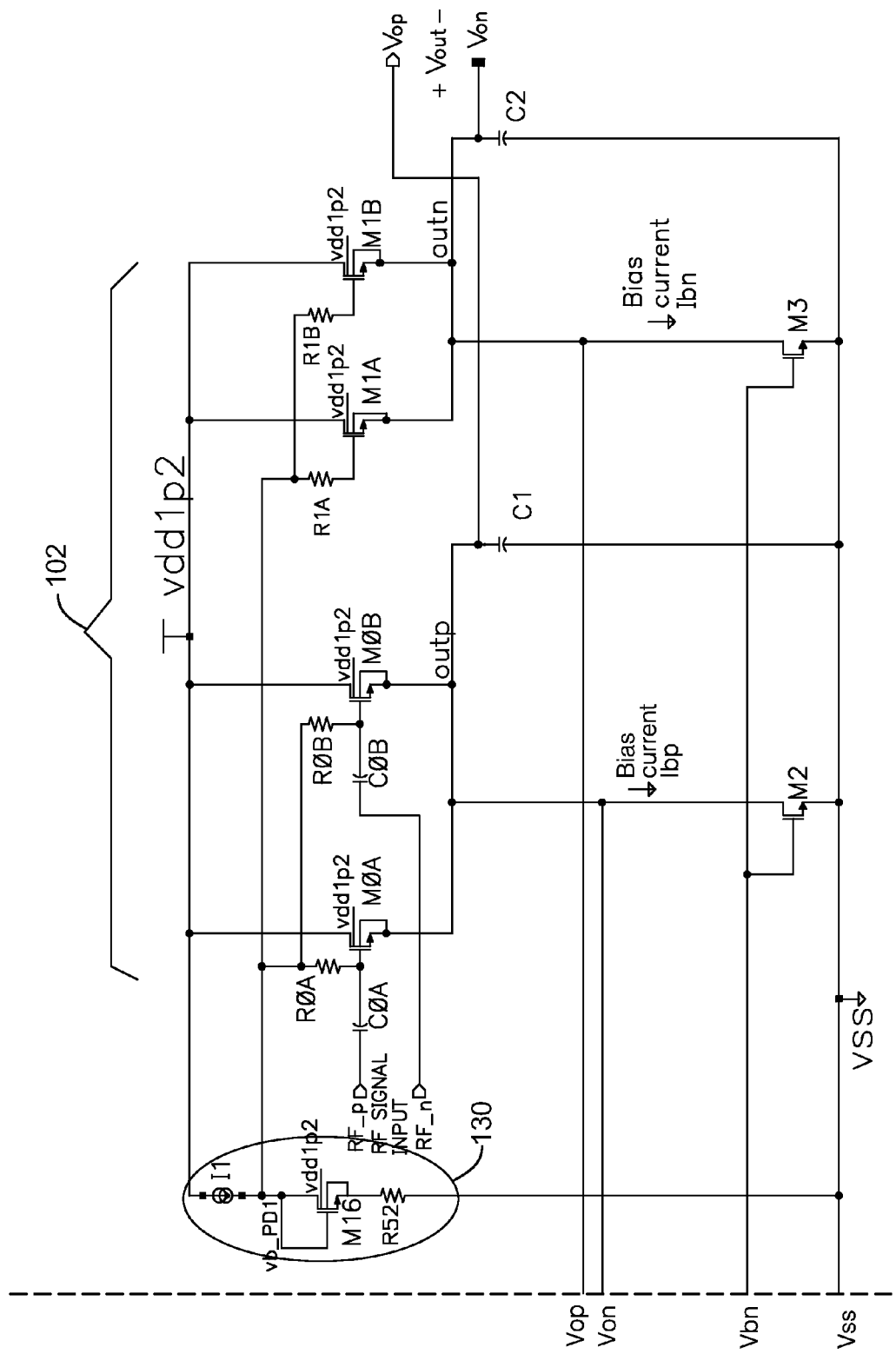
Figure 11A:
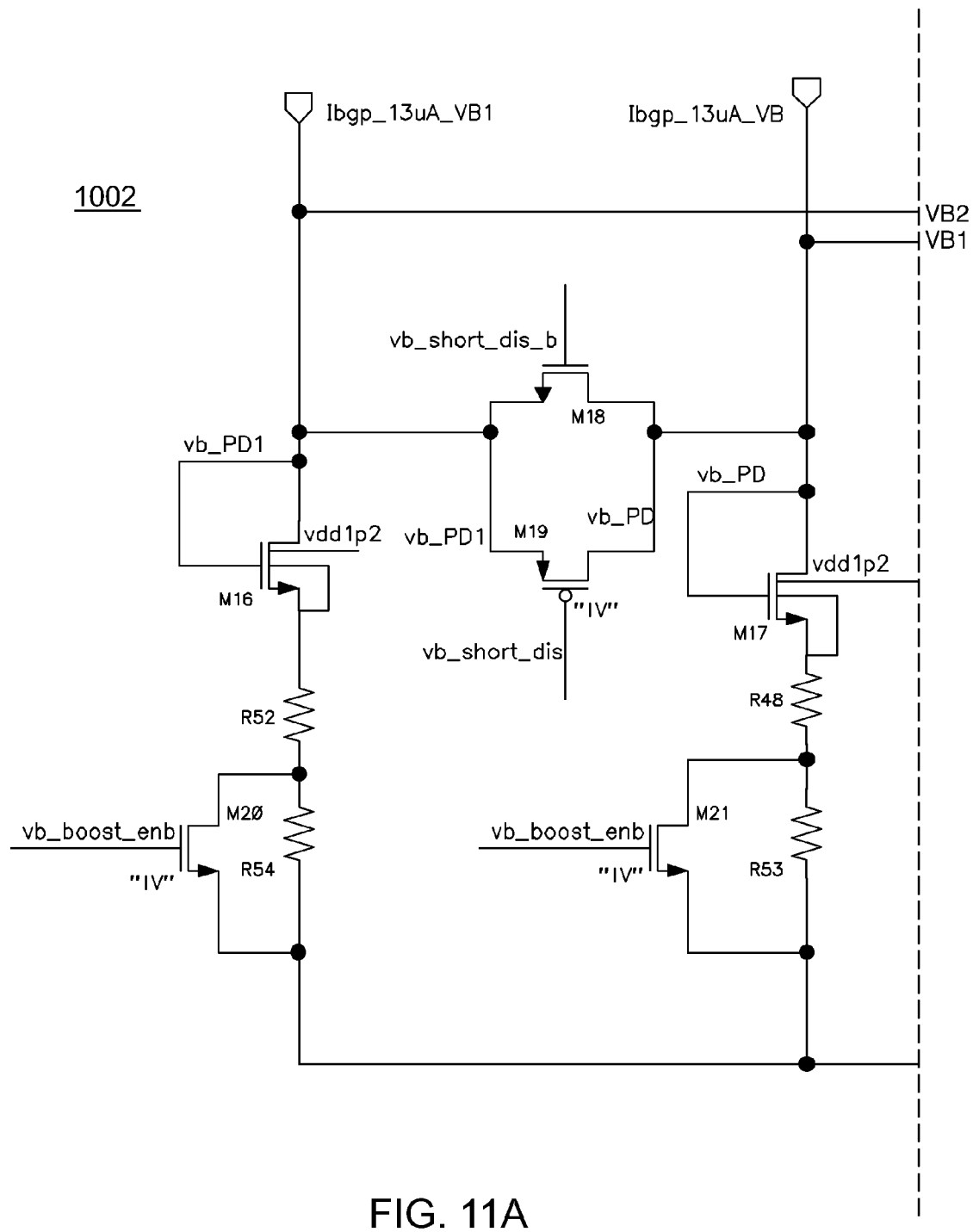
FIGS. 11A through 11D is an example complete ED core circuit, including the feedback linearizer, with additional programmability capabilities for multi-mode adaptation.
Figure 11B:
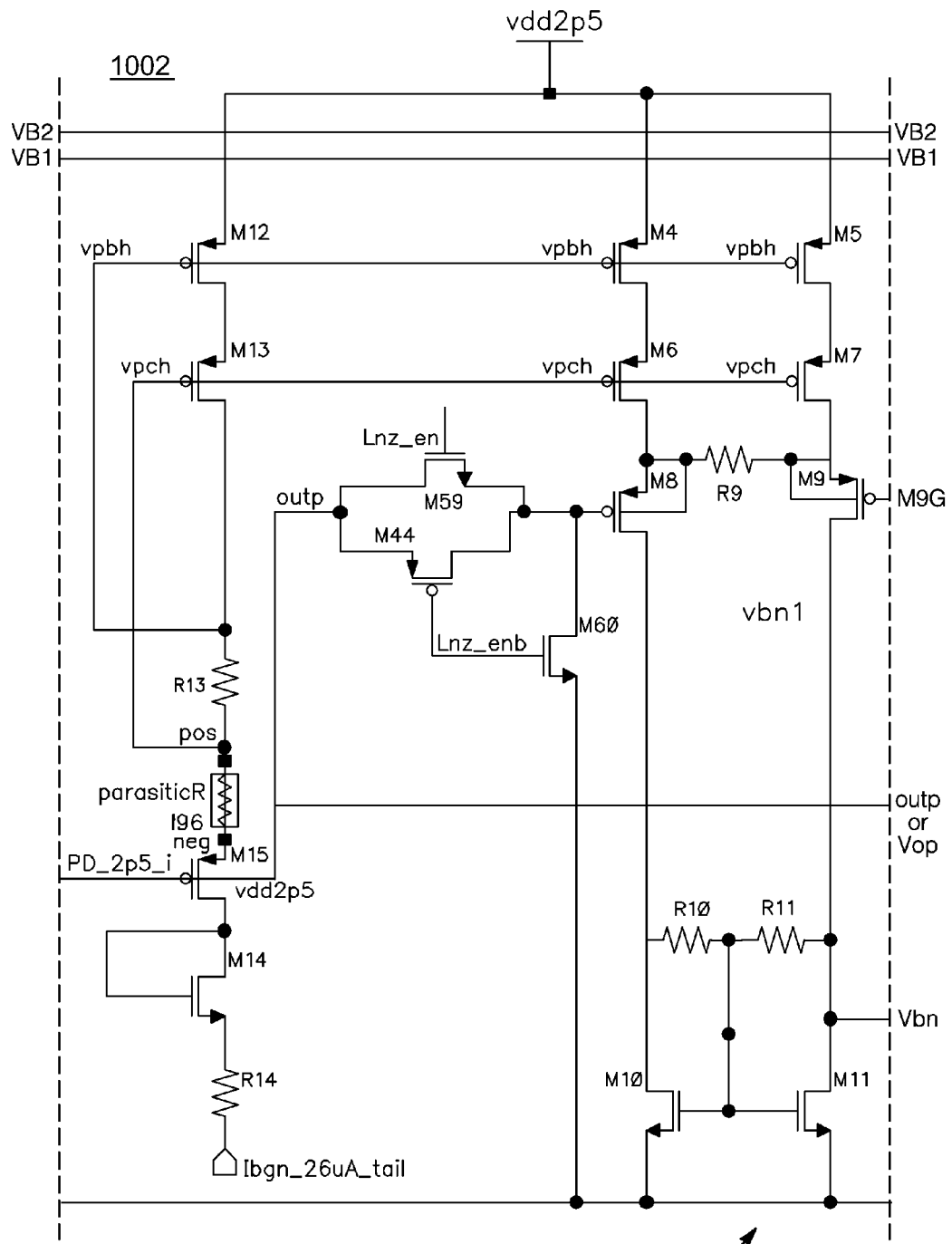
Figure 11C:
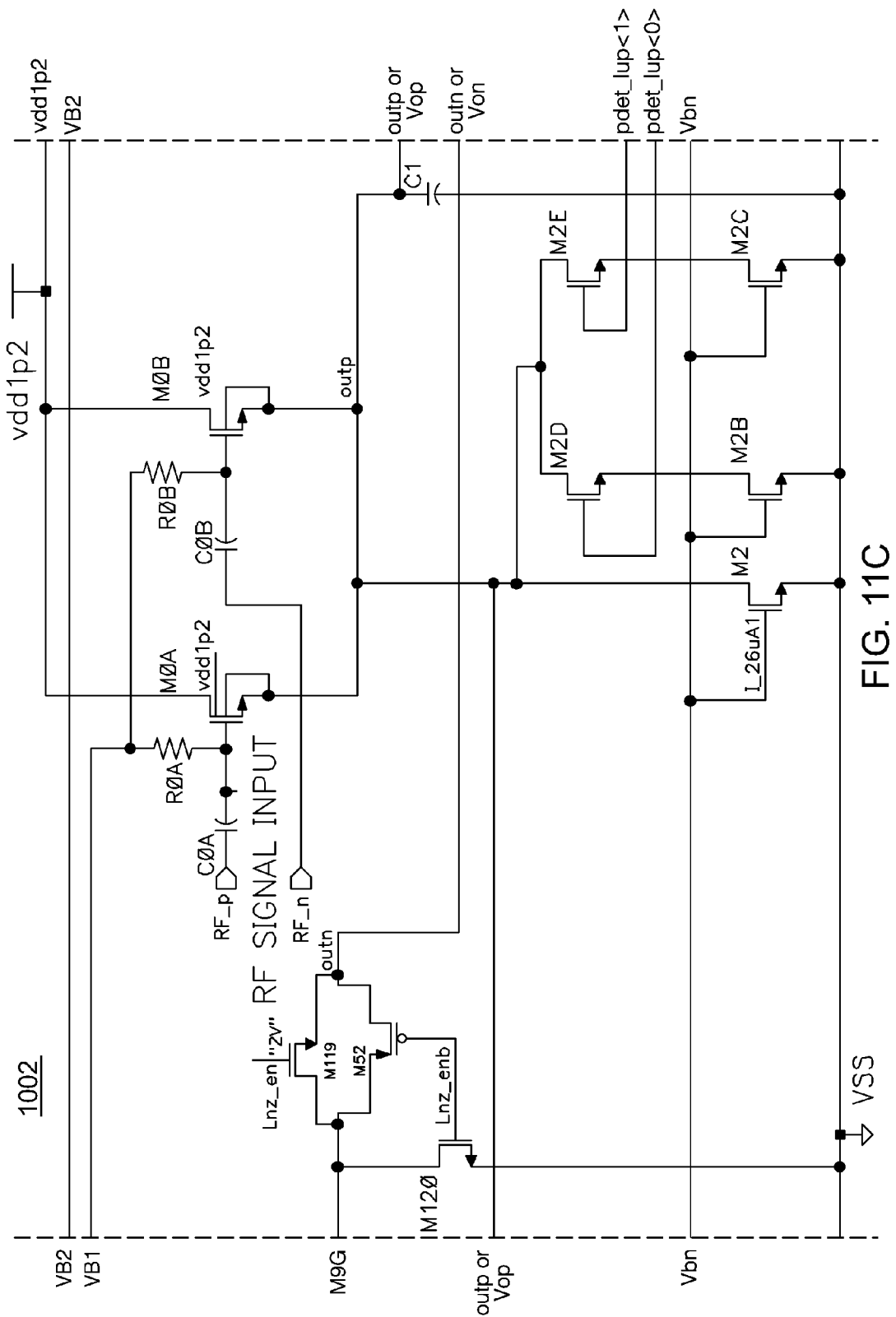
Figure 11D:
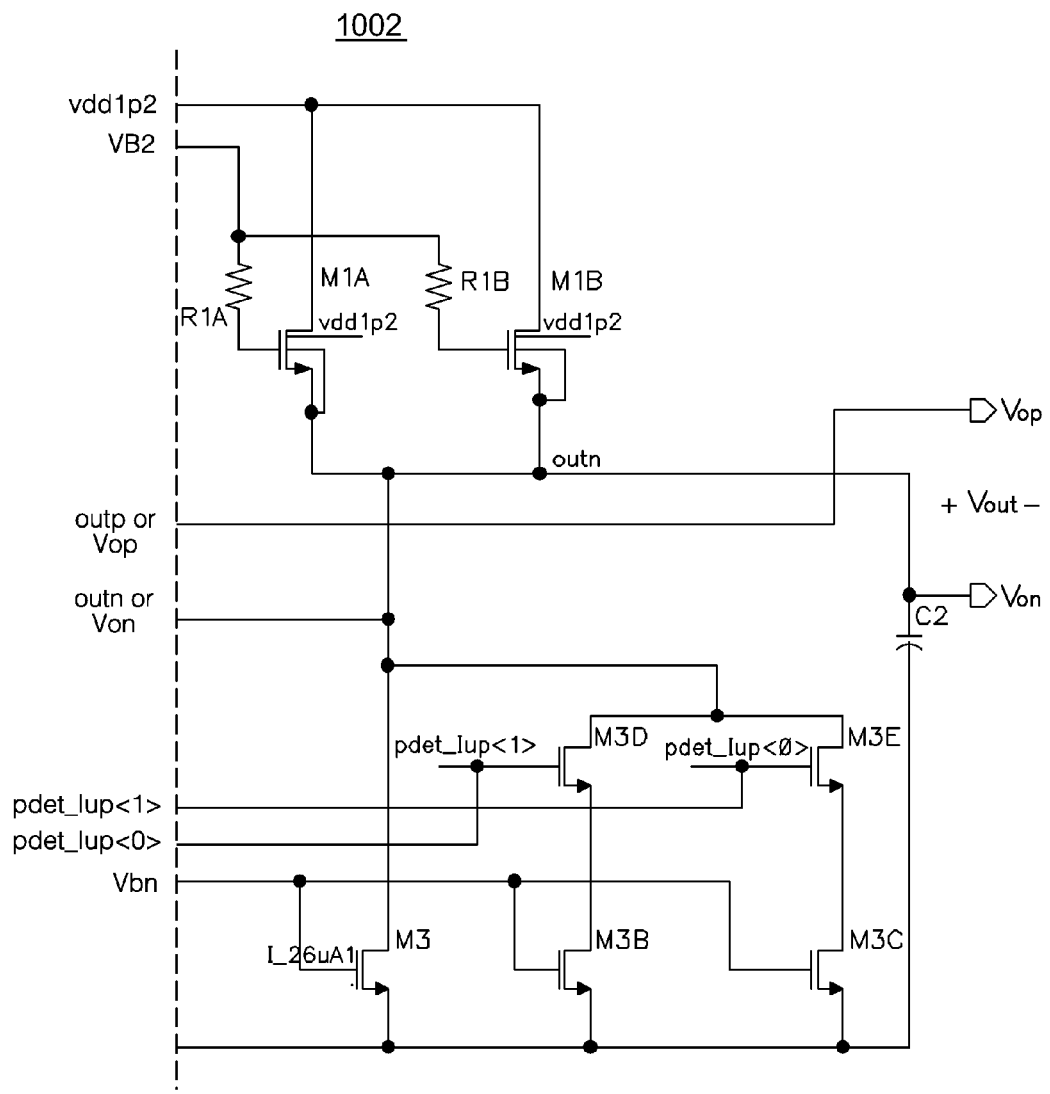

FIGS. 10A and 10B is an example circuit of a bias-varying envelope detector (ED) core 102 (FIG. 10B) with a feedback linearizer 104 (FIG. 10A). The example circuit in FIG. 10B may also include a voltage bias generator 130. The transistor M0 from FIG. 4 now includes two differential transistors, M0A and M0B, connected in parallel to each other. Likewise, transistor M1 now includes differential transistors M1A and M1B, connected in parallel to each other.

The input TX RF signal is differentially AC-coupled to gates of transistors M0A and M0B after passing through capacitors C0A and C0B. When there is no input RF signal, a total bias current Ibp of about 2.4 uA may be symmetrically passed through M0A and M0B, and a total bias current Ibn of about 2.4 uA may also be symmetrically passed through M1A and M1B. This means that, if M0A and M0B are substantially symmetrical, then each will carry about 1.2 uA of current. Similarly, if M1A and M1B are substantially symmetrical, then each will carry about 1.2 uA of current. The bias current (Ibp or Ibn) of about 2.4 uA puts the transistors in deep subthreshold, but the bias current can increase with RF input amplitude up to about 50 uA, which is still in the subthreshold region. Other bias current ranges are possible where the transistors differ in type and size.

Accordingly, all transistors M0 and M1 are biased in the subthreshold region so that the ED 100 operates more linearly as an envelope detector. When the amplitude of the input TX RF signal is more than zero, the voltage output (Vop and Von) will grow proportionally to the input amplitude as will be explained.

Transistor M2 provides the bias current Ibp to transistors M0A and M0B and transistor M3 provides the bias current Ibn to transistors M1A and M1B. The feedback linearizer 104 may be configured to set the bias voltage for transistors M2 and M3, using the differential ED outputs, Vop and Von, as inputs.

The different ED outputs, Vop and Von, drive at least two transistors, M8 and M9 of the feedback linearizer 104, which may be of a differential amplifier design. The output of the linearizer 104 is Vbn, which is proportional to $V_{out}$, where $V_{out}$ equals Vop–Von. More specifically, $$V_{bn}=V_{bn\_0}+KV_{out} \quad (9)$$

K is the gain of the linearizer, which is set approximately by Equation (10):

$$\frac{(R10 + R11)}{R9 + \dfrac{2}{gm(M8, M9)}} \quad (10)$$

Because Vbn provides the bias voltage to M2 and M3, which provide the bias current of the detection input transistors M0A through M1B, as Vout increases, the bias currents Ibp and Ibn will increase, which is the desired result as discussed with reference to FIGS. 7 and 8. That is, because Ibp and Ibn increase as Vout increases, the transistors M0A through M1B may continue to operate in the more-linear subthreshold regions and over a wider amplitude range, including smaller and larger input amplitude RF signals.

The feedback linearizer 104 shown FIG. 10A may include a diffpair made up by transistors M4 through M11 in a feedback loop as shown in FIG. 9, where Vop and Von directly drive transistors M8 and M9, respectively. Degeneration resistor R9 may be connected between sources of M8 and M9. Transistor M10 may have its drain connected to the drain of M8, where the drain of M8 may drive the gate of transistor M10 through resistor R10. Transistor M9 may have its drain connected to the drain of M11, where the drain of M9 may drive the gate of transistor M11 through resistor R11. Resistors R10 and R11 may be connected to each other and to the gates of M10 and M11. Resistors herein may also be referred to as impedances.

Transistors M4 and M6 may be connected in series and provide a first bias current to transistors M8 and M10. Transistors M5 and M7 may be connected in series and provide a second bias current to transistors M9 and M11.

Transistor M12 may have a gate connected to gates of M4 and M5 and transistor M13 may have a gate connected to gates of M6 and M7. Transistors M12 and M13 may be connected in series to each other and be configured to set the first and second bias currents by driving the transistors M4 through M7. A reference current bias block I2 may generate bias voltages Vpbn and Vpcn through transistors M12 and M13. Resistors R13 and R14 may be connected in series-like configuration to each other between the drain of the M13 and the current bias block I2. A gate of the M12 may be connected to the drain of M13 and a gate of the M13 may be connected between R13 and R14.

The transistors of FIGS. 10A and 10B and the current bias block I2 may be configured such that the output Vbn includes a bias voltage that is proportional to a difference between the positive and negative ED outputs ($V_{out}$) with which to drive the biasing transistors M2 and M3, to keep the envelope-detecting transistors M0A through M1B operating in sub-threshold regions despite a widened voltage amplitude range of a radio frequency (RF) signal input to the ED.

The feedback linearizer 104 may be effective over the bandwidth of an envelope that it is detecting, for instance, 2 MHz for the 3G standard, which is much smaller than the input signal frequency, for instance approximately 2 GHz.

The voltage bias generator 130 may include current bias block I1 connected to power (Vdd) and transistor M16 having a gate and a drain connected to the current bias block. A resistor R52 may be connected between a source of M16 and ground (Vss). The voltage bias generator 130 may be configured to adjust a bias voltage of the detecting transistors M0A through M1B to follow a threshold voltage variation of transistor M16, to maintain substantially constant bias voltages for the positive and negative ED outputs, Vop and Von.

Because detecting transistors M0A through M1B may be exposed to excessive voltages and because the ED 100 is configured to handle a widened voltage swing at the RF inputs, transistors M0A, M0B, M1A and M1B may be high-voltage (e.g., thick oxide) devices but powered with a lower voltage supply to ensure reliability. For example, the input voltage to each detecting transistor may be allowed to reach plus or minus about 1 (one) volt peak, but the detecting transistor may have voltage biases of about 300 mV. Following this example, $V_{dg}$ (the drain-gate voltage) of the M0 transistors can be Vdd−(0.3−1)=Vdd+0.7, which is safe for thick oxide devices in a 40 nm process, for instance.

The feedback paths (Vop to Vbn and Von to Vbn) of the linearizer 104 do not require stringent linearity, as the paths are used to set both positive and negative bias currents, Ibp and Ibn. Because $V_{out}$ equals Vop minus Von, the nonlinear effect of either or both of the bias currents with respect to $V_{out}$ is cancelled out, which relaxes the linearizer circuit and makes it power and area efficient. Nevertheless, the degeneration resistor R9 and the ratio of (R11+R10)/R9 provide sufficiently stable and linear gain for operation of the linearizer circuit.

FIGS. 11A through 11D is an example complete ED core circuit 1002, including the feedback linearizer 104, with additional programmability capabilities for multi-mode adaptation. Additional calibration and adjustment options are not required but may be added to make the final design practical and for general use across varying communication standards (e.g., 2G/3G/LTE) of cellular transmitters.

As a multi-mode option, the complete ED core circuit 1002 may be converted to a standard ED, something like ED core 60, by converting the linearizer 104 to a bias-only block. This conversion may be executed by disconnecting the linearizer inputs and grounding the linearizer inputs through switches M44, M59, M60 and M119, M120 and M52.

The bias current of the ED core 1002 may be further statically programmed by enabling transistors M2B, M2C, M2D and M2E and transistors M3B, M3C, M3D and M3E using control signals pdet_lup<0:1>. The voltage bias for M0A through M1B may also be generated separately to add the capability of varying the detecting transistors M0A through M0B separately, thus adding a DC voltage shift to Vout to accommodate the dynamic signal range of the next analog-to-digital converter 12 or buffer block input.

Figure 12:
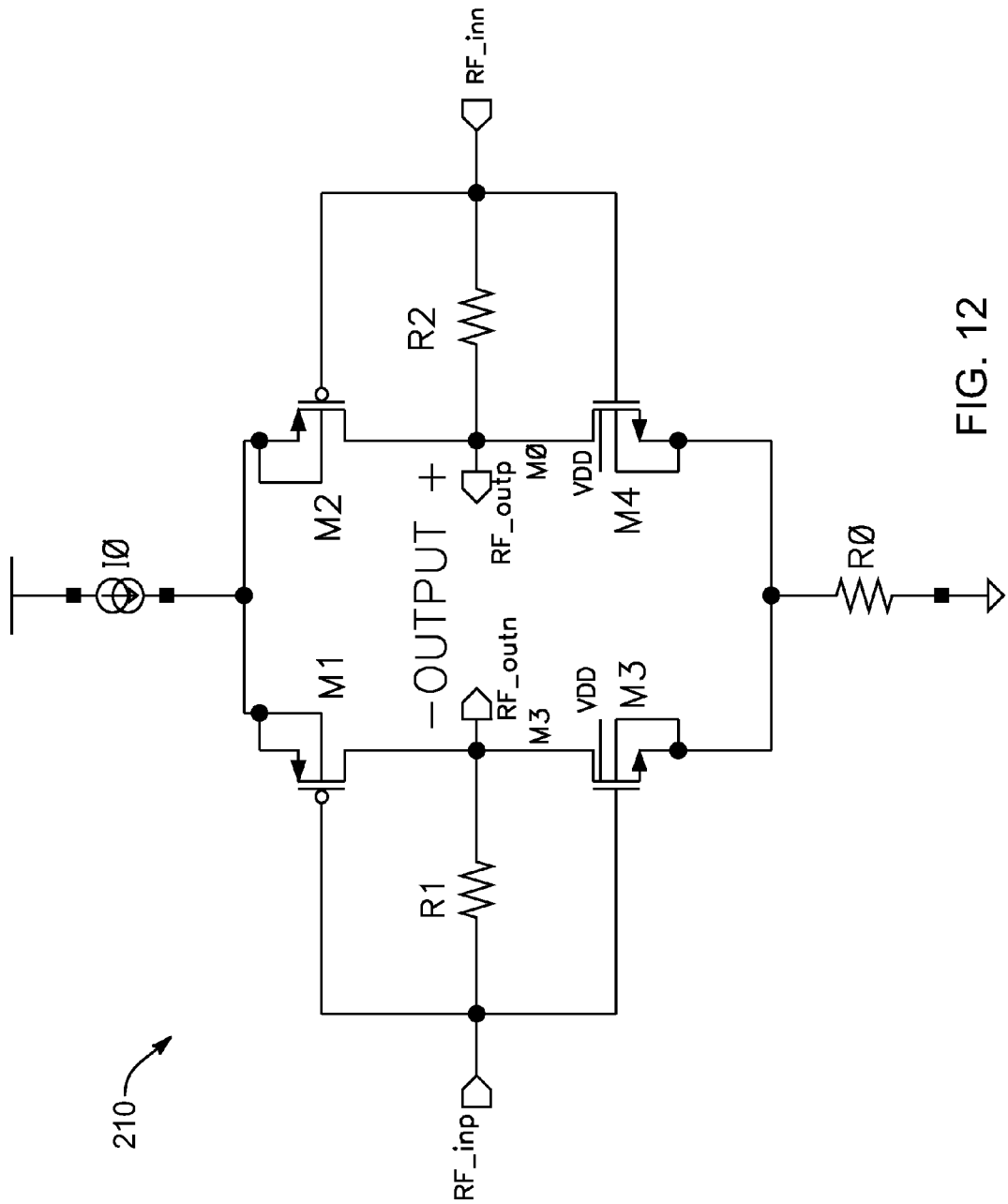
FIG. 12 is an example circuit of a typical radio frequency (RF) amplifier.

FIG. 12 is an example circuit of a typical radio frequency (RF) amplifier 210, which may be used as voltage amplifiers 110, 112 and 114 for the gain stages discussed with reference to FIG. 5. The RF amplifier 210 of FIG. 12 may be designed with a complementary CMOS architecture using transistors M1, M2, M3 and M4. A current bias block I0 and degeneration resistor R0 may be variable, to vary the gain of each stage. The gain amplifier stages may be AC-coupled to each other. Resistors R1 and R2 provide DC feedback that creates a bias at the differential inputs (RF_inp and RF_inn) and outputs (RF_outp and RF_outn) of the amplifier 210.

Figure 13A:
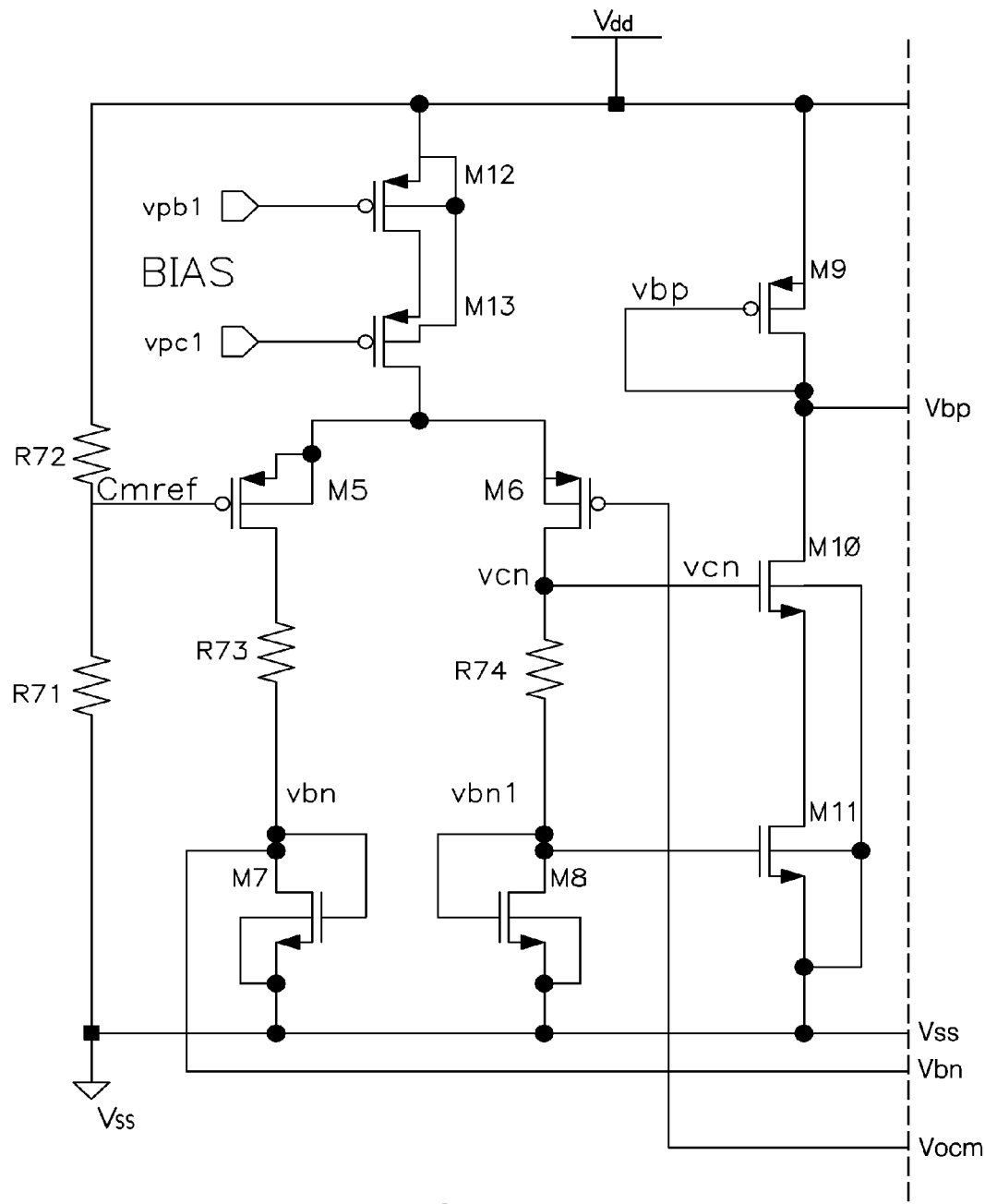
FIGS. 13A and 13B is an example circuit of a specialized class-AB, RF amplifier to act as a pre-driver to the envelope detector of FIGS. 5 and 9-11.
Figure 13B:
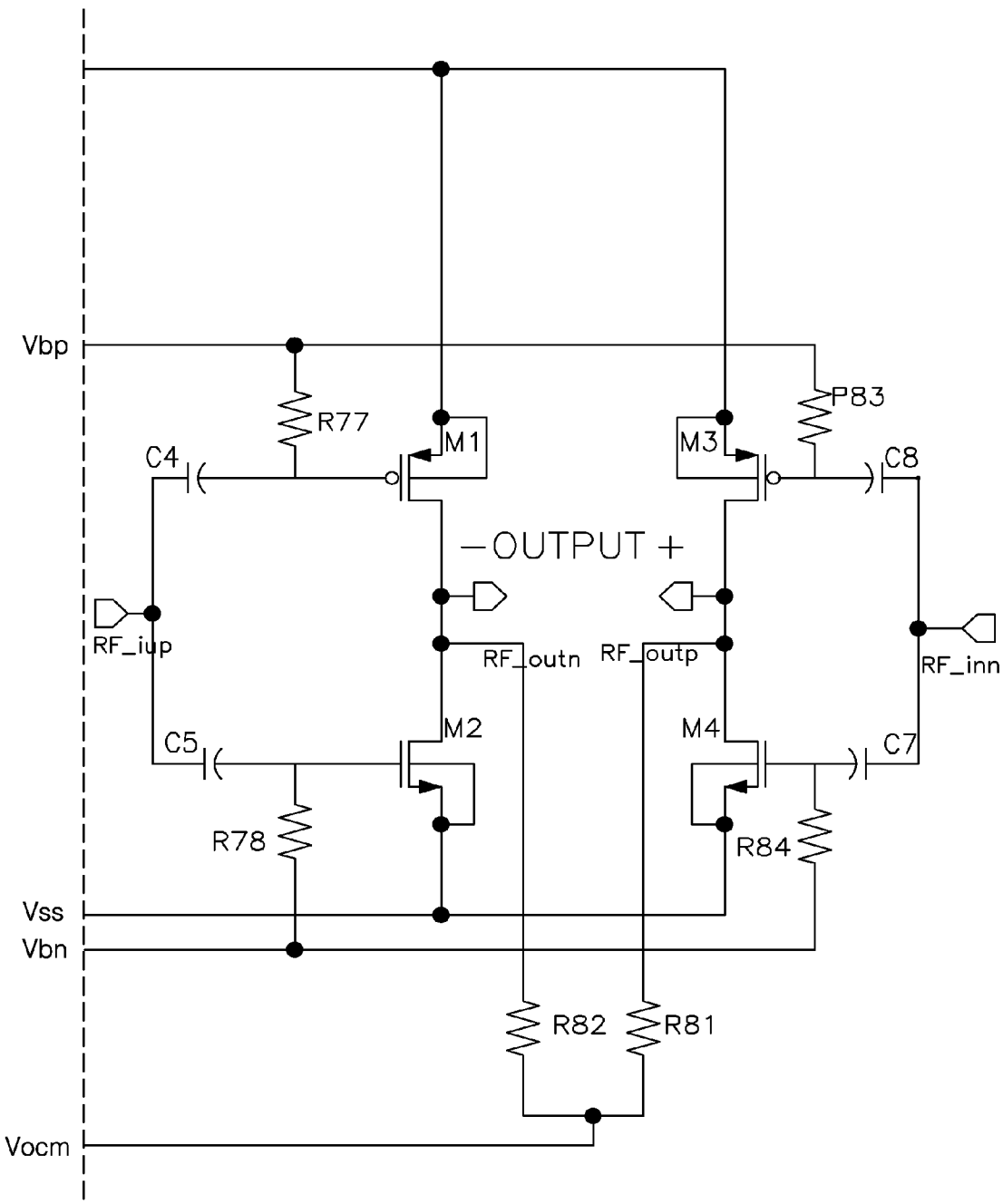

FIGS. 13A and 13B is an example circuit of the class-AB RF amplifier 116 that may act as a pre-driver to the envelope detector 102 of FIGS. 5 and 9-11. As the linear range extension of the ED 100 is both at higher and lower amplitude, the pre-driver or amplifier before the ED core 102 should be configured to handle a large signal swing up to 1 (one) volt (V) peak or more. The class-AB amplifier 116 of FIGS. 13A and 13B was specifically designed to handle this voltage swing and configured to operate within a full linear voltage range of the ED core 104.

A core of the class-AB amplifier 116 may be complementary CMOS architecture, but any complementary transistor architecture will suffice, so CMOS devices are not required, as discussed. More specifically, transistors M1 and M2 may be complementary and connected in series to each other. Transistors M3 and M4 may be complementary and connected in series to each other. Transistors M1, M2, M3 and M4 include AC-coupled inputs from the RF input signal of the last of the voltage amplifiers, e.g. voltage amplifier 114 in FIG. 5.

Separate biasing voltages, Vbp and Vpn, are provided in a feedback loop to, respectively, p-type transistors M1 and M3 and n-type transistors M2 and M4. Transistor M9 may provide a positive bias voltage to M1 and M3. Transistor M7 may provide a negative bias voltage to M2 and M4. The different bias voltages provide maximum output peak-to-peak linear swing range close to the supply voltage Vdd of about 2.5V, for instance.

Simultaneously, the feedback circuitry including transistors M5 through M8 sets a common (DC) voltage at the output ($V_{out\_DC}$) of the class-AB amplifier 116 close to half of the power supply voltage, e.g., about 1.25V for a Vdd of approximately 2.5V. This feedback of the common voltage may be performed through two negative paths of the class-AB amplifier, one that determines Vbn at transistor M7 and the other that determines Vbn1 at transistor M8. Voltage signals Vbn and Vbn1 are determined by the arrangement of transistors M9 through M13.

Transistors M10 and M11 may be connected in series to each other and to M9 and be complementary to M9. Vbn, generated by M8, may then provide a bias voltage to M10 and Vcn, generated by M6, may provide a bias voltage to M10. As Vbn1 is increased, Vbp is lowered, which pulls $V_{out\_DC}$ higher.

Transistors M6 and M8 may be complementary and connected in series with each other. Transistors M5 and M6 may also be complementary and connected in series with each other. Transistors M12 and M13 may be connected in series with each other, and may be a single transistor or two separate transistors. External bias signals Vpb1 and Vpc1 may drive gates of M12 and M13, respectively, thus determining a bias current that is to be split between M5 and M7 on the one hand and M6 and M8 on the other.

When $V_{out\_DC}$ decreases, more current will be drawn for M6 and M8, setting Vbn1 higher. A higher Vbn1 increases current for M9, making Vbp go lower. As Vbp goes lower, $V_{out\_DC}$ is pulled higher.

Simultaneously, currents sum for transistors M5 through M8, which current is kept substantially constant as biased through externally-controlled Vpb1 and Vpc1 at gates of M12 and M13. Accordingly, when currents drawn for M6 and M8 increases, currents drawn for M5 and M7 will decrease, resulting in a lower bias voltage provided to Vbn for transistors M2 and M4. As Vbn goes lower, $V_{out\_DC}$ goes higher.

By adjusting Vbn and Vbn1, therefore, the $V_{out\_DC}$ common biasing voltage may also be set as equal to Cmref. Because resistance of resistors R72 and R71 may be equal and create a voltage divider, Cmref may be set to be about half of Vdd, the power supply voltage. A different ratio of Vdd may be used by adjusting resistance of resistors R72 and R71, but setting $V_{out\_DC}$ at about half Vdd provides the largest possible swing in input voltage of the class-AB amplifier 116 in both smaller signal and larger signal directions.

Figure 14:
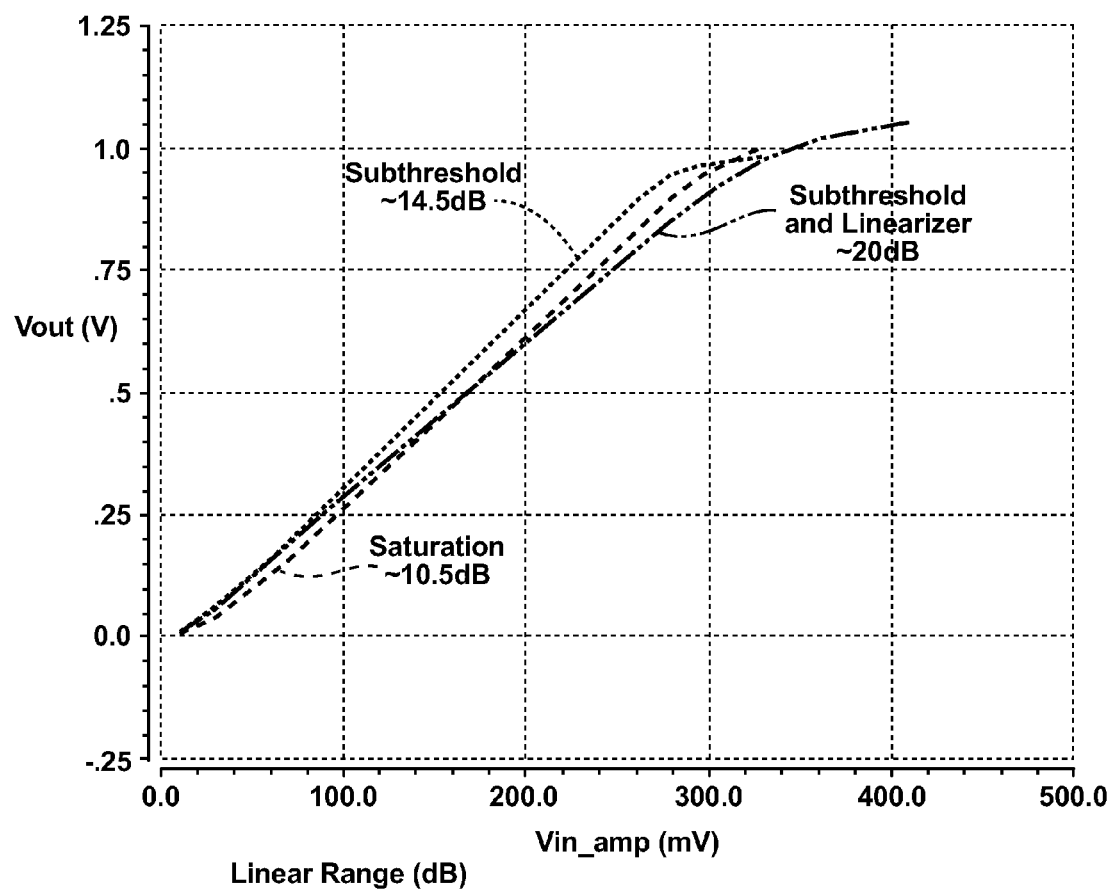
FIG. 14 is a graph of linear range improvement of the output of the ED core of FIGS. 5 and 9-11.
Figure 15:
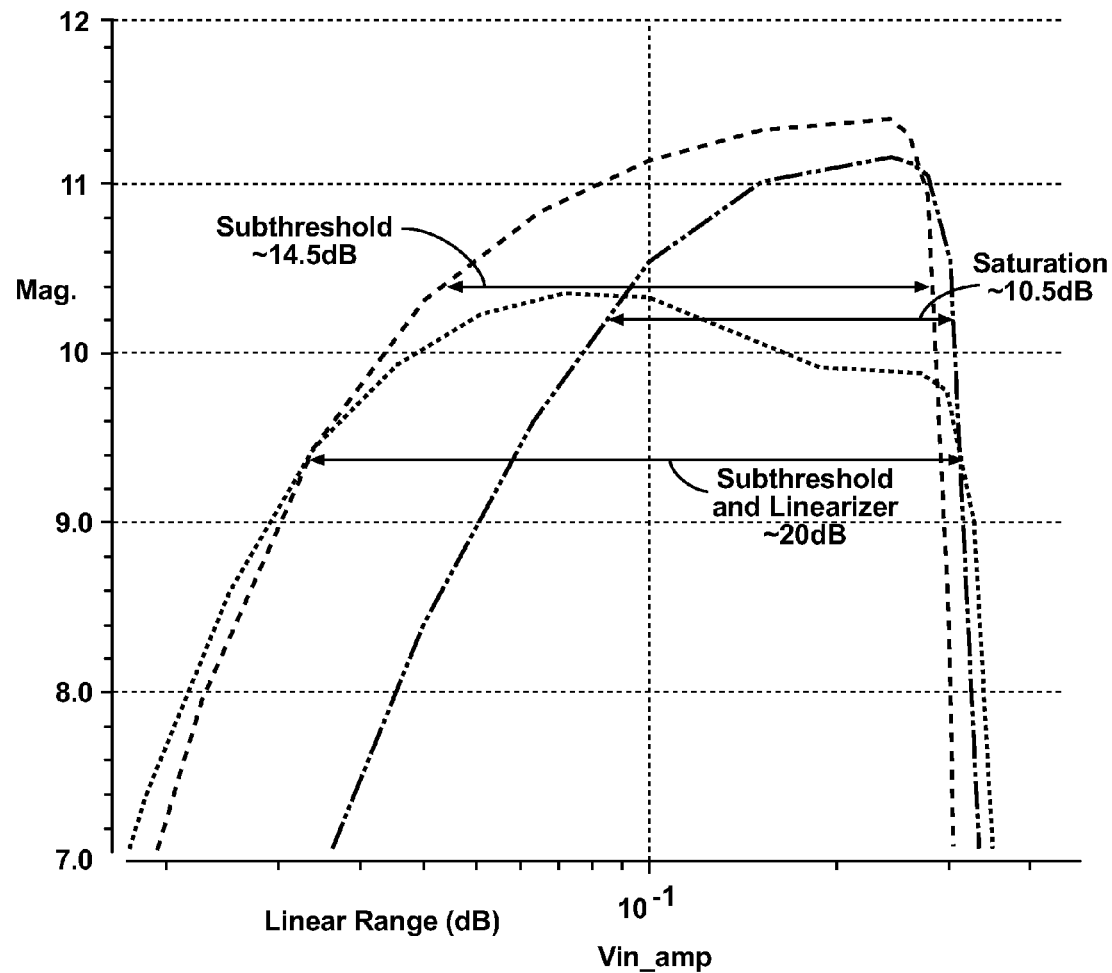
FIG. 15 is a graph of the slope of the curves of the graph of FIG. 14.

FIG. 14 is a graph of linear range improvement of the output of the ED core 102 of FIGS. 5 and 9-11. FIG. 15 is a graph of the slope of the curves of the graph of FIG. 14. The range is determined by the linear part of each curve of FIG. 14. The dashed line shows a linear range of about 10.5 dB when the conventional ED core 60 is biased in saturation. The dotted line shows a linear range of about 14.5 dB when the conventional ED core 60 is biased in subthreshold. The dotted/dashed line shows a linear range of about 20 dB when the enhanced ED core 102 is biased in subthreshold and when its biasing transistors are driven by the linearizer 104. A linear range of 20 dB is a significant improvement over the conventional ED core 60, even when the conventional ED core is biased in subthreshold regions.

Figure 16:
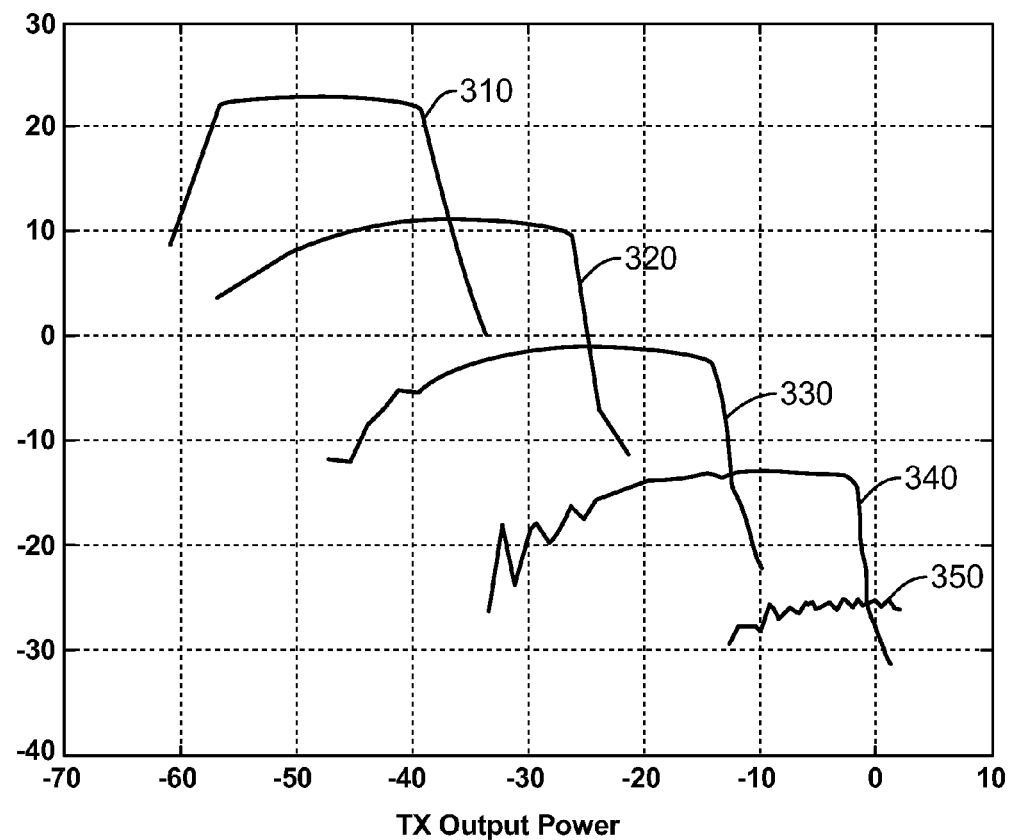
FIG. 16 is a graph of the ED output slope measured from a fabricated microchip in decibels (dB) versus TX output power, showing additional linear range added by respective gain amplifier stages of FIG. 5 with variable overlap between the gain amplifier stages.

FIG. 16 is a graph of the ED output slope in decibels (dB) versus TX output power measure from a fabricated microchip for the enhanced ED 100, showing additional linear range added by respective gain amplifier stages of FIG. 5. The total linear range for the ED 100 is 60 dB with variable overlap greater than 4 dB between the gain amplifier stages, each of which can provide up to about 20 dB. A significant amount of overlap may be required by closed loop power control (CLPC) and other calibration algorithms. The gain stage settings may be set, however, to increase the total linear range but with less overlap.

Output 310 shows use of all the gain stages. At output 310, the ED amplifiers may achieve a maximum gain, but at the lowest TX power. Output 320 shows use of one gain stage less than used for output 310. Output 330 shows use of two gain stages less than used for output 310. Output 340 shows use of three gain stages less than used for output 310. Finally, output 350 shows an instance where even the class-AB amplifier 116 is bypassed to further reduce the gain, and thus the full linearity range of the ED core 102 cannot be utilized in this situation. Output 350 may provide an optional setting for higher power applications where there is less linearity required.

Figure 17A:
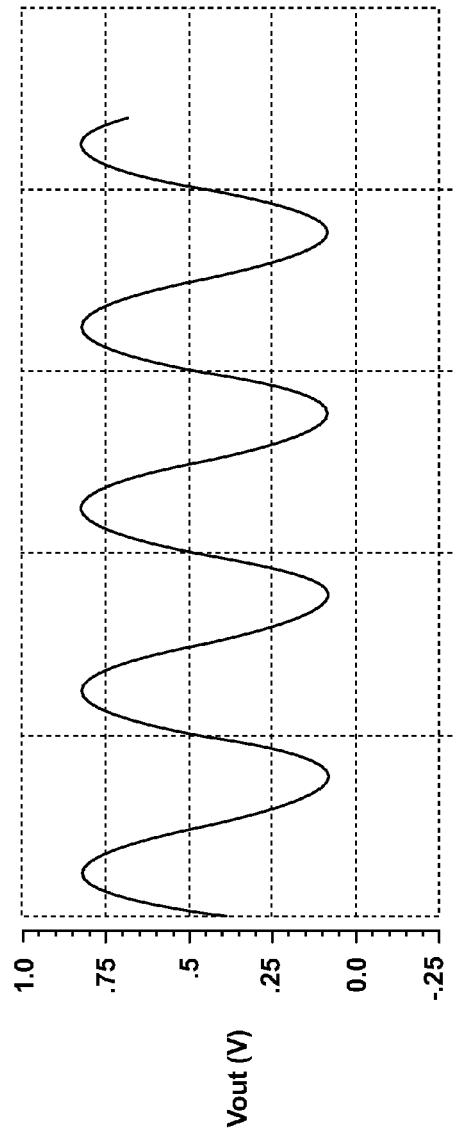
FIGS. 17A and 17B are, respectively, (a) a graph of an example envelope detected at the output of the ED of FIGS. 5 and 9-11; and (b) an example amplitude-modulated voltage input to the ED with an envelope varying over the linear range of the ED.
Figure 17B:
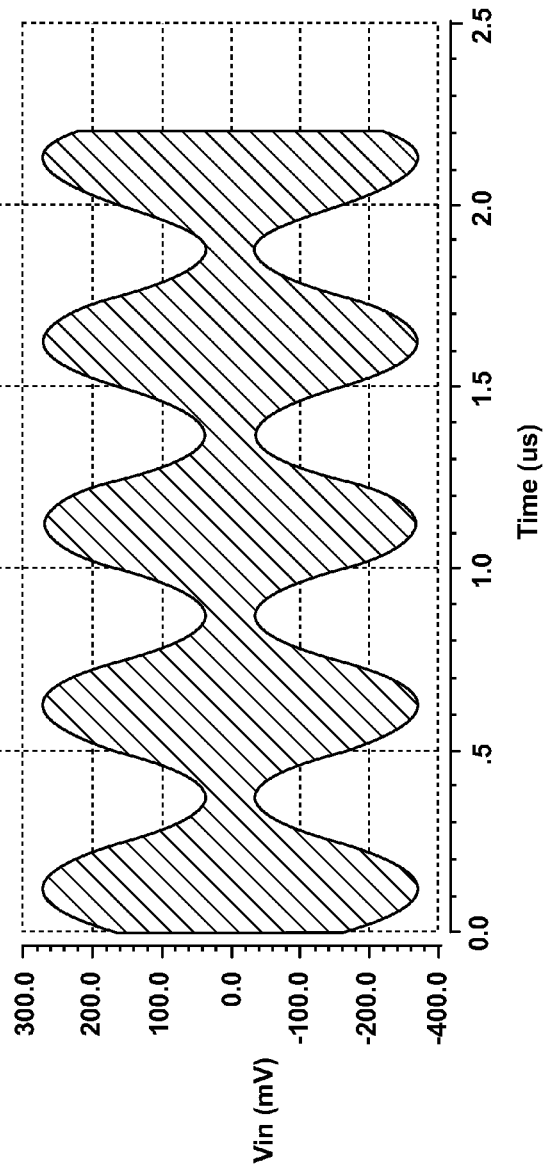
Figure 18:
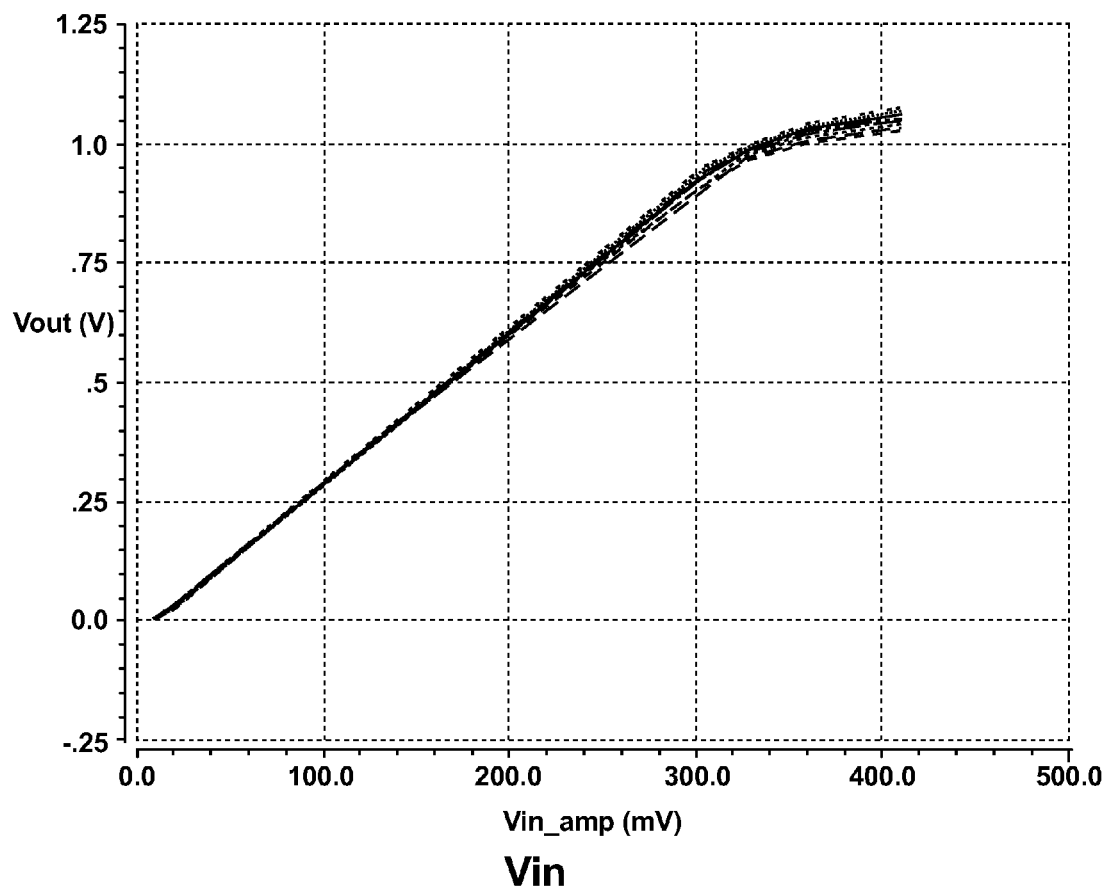
FIG. 18 is an example graph of $V_{out}$ versus $V_{in}$ of an envelope detector with a linearizer, from simulation over process, voltage, and temperature (PVT) corners.

FIGS. 17A and 17B are, respectively, (a) a graph of an example envelope detected at the output of the ED of FIGS. 5 and 9-11; and (b) an example amplitude-modulated voltage input to the ED with an envelope varying over the linear range of the ED. FIG. 18 is an example graph of $V_{out}$ versus $V_{in}$ of the ED 100 with the linearizer 104 during simulation for different process, voltage, and temperature (PVT) corners.

The methods, devices, and logic described above may be implemented in many different ways in many different combinations of hardware, software or both hardware and software. For example, all or parts of the system may include circuitry in a controller, a microprocessor, or an application specific integrated circuit (ASIC), or may be implemented with discrete logic or components, or a combination of other types of analog or digital circuitry, combined on a single integrated circuit or distributed among multiple integrated circuits.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. An envelope detector comprising:
a voltage-mode envelope detector (ED) core including parallel detection transistors configured to detect a voltage envelope of a radio frequency (RF) signal input, the RF signal input including a cellular transmitter (TX) output; and
multiple voltage amplifiers positioned serially in gain stages between the TX output and the ED core and configured to provide a first linear voltage range of the envelope detector, where the multiple voltage amplifiers comprise a driving voltage amplifier configured to drive the ED core and that comprises a class-AB RF amplifier configured to operate over a second linear voltage range of the ED core.

2. The envelope detector of claim 1, where the class-AB amplifier is configured to amplify a signal swing comprising at least a plus or minus one volt peak.

3. The envelope detector of claim 1, where the multiple voltage amplifiers further comprise a first gain stage voltage amplifier configured to receive the TX output and to remain ON during operation and gain settings changes.

4. The envelope detector of claim 1, where the first linear voltage range extends up to at least 60 decibels (dB) and the second linear voltage range extends up to at least 20 dB.

5. The envelope detector of claim 1, where the parallel detection transistors are configured to tolerate at least a voltage swing of plus one to minus one volt.

6. The envelope detector of claim 1, where the class-AB RF amplifier comprises:
complementary first and second transistors configured to provide a negative RF output at interconnected drains;
complementary third and fourth transistors configured to provide a positive RF output at interconnected drains; and
a feedback circuit connected to the positive and negative RF outputs and to a power supply, the feedback circuit configured to set a common voltage at the positive and negative RF outputs of approximately half the power supply voltage, such that the positive and negative RF outputs swing through a range approximately as large as the power supply voltage, to drive the ED core over the second linear range.

7. The envelope detector of claim 6, where the feedback circuit of the class-AB RF amplifier is configured to provide the common voltage through two negative feedback paths of the class-AB RF amplifier.

8. An envelope detector comprising:
a voltage-mode envelope detector (ED) core configured to detect a voltage envelope of a radio frequency (RF) signal;
an RF input configured to receive the RF signal from a transmitter;
the ED core characterized by a first linear voltage range; and
series connected amplifiers comprising:
a first amplifier stage configured to receive the RF signal; and
a second amplifier stage in series after the first amplifier stage, the second amplifier stage comprising a class-AB RF amplifier and configured to drive the ED core in operation over the first linear voltage range;
the series connected amplifiers configured to provide, with the envelope detector core, a second linear voltage range that is greater in extent than the first linear voltage range.

9. The envelope detector of claim 8, where the series connected amplifiers comprise a linear range overlap between each other of greater than 4 dB.

10. The envelope detector of claim 8, where the class-AB amplifier is configured to amplify a signal swing comprising at least a plus or minus one volt peak.

11. The envelope detector of claim 8, where the first linear voltage range extends up to at least 20 decibels (dB) and the second linear voltage range extends up to at least 60 dB.

12. The envelope detector of claim 8, where the first amplifier stage is further configured to remain ON during operation and gain setting changes.

13. The envelope detector of claim 8, where the class-AB RF amplifier comprises:
complementary first and second transistors configured to provide a negative RF output at interconnected drains;
complementary third and fourth transistors configured to provide a positive RF output at interconnected drains; and
a feedback circuit connected to the positive and negative RF outputs and to a power supply, the feedback circuit configured to set a common voltage at the positive and negative RF outputs of approximately half the power supply voltage, such that the positive and negative RF outputs swing through a range approximately as large as the power supply voltage, to drive the ED core over the first linear range.

14. The envelope detector of claim 13, where the feedback circuit of the class-AB RF amplifier is configured to provide the common voltage through two negative feedback paths of the class-AB RF amplifier.

15. A method comprising:
receiving, with an envelope detector (ED), a radio frequency (RF) input from a signal transmitter driver, the ED configured to detect a voltage envelope of the RF input;
passing the RF input to a first amplifier stage of series connected amplifiers of the ED, where the ED is characterized by a first linear voltage range;
passing an output of the first amplifier stage through the series connected amplifiers to a driving amplifier stage comprising a class-AB RF amplifier; and
driving a voltage-mode envelope detector (ED) core of the ED with the class-AB RF amplifier over a second linear voltage range of the ED core that is smaller in extent than the first linear voltage range.

16. The method of claim 15, further comprising:
varying a bias current of detecting transistors of the ED core proportionally according to a difference of amplitude between positive and negative ED outputs.

17. The method of claim 15, further comprising:
providing positive and negative RF outputs of the ED back into the ED core; and
setting a common voltage at the positive and negative RF outputs of approximately half a power supply voltage, such that the positive and negative RF outputs swing through a range approximately as large as the power supply voltage, to drive the ED core over the second linear range.

18. The method of claim 15, further comprising:
causing the class-AB RF amplifier to amplify a signal swing comprising at least a one volt peak.

19. The method of claim 15, further comprising:
forcing the first stage amplifier to remain ON during operation and gain settings changes.

20. The method of claim 15, further comprising:
configuring the series connected amplifiers to include a linear range overlap between each other of greater than 4 dB.

* * * * *